(12) United States Patent
Smayling et al.

(10) Patent No.: US 9,824,859 B1
(45) Date of Patent: Nov. 21, 2017

(54) PRECISION MATERIAL MODIFICATION USING MINIATURE-COLUMN CHARGED PARTICLE BEAM ARRAYS

(71) Applicant: Multibeam Corporation, Santa Clara, CA (US)

(72) Inventors: Michael C. Smayling, Fremont, CA (US); Kevin M. Monahan, Cupertino, CA (US); David K. Lam, Saratoga, CA (US); Theodore A. Prescop, San Jose, CA (US)

( * ) Notice: Subject to any disclaimer, the term of this patent is extended or adjusted under 35 U.S.C. 154(b) by 100 days.

(21) Appl. No.: 14/980,884

(22) Filed: Dec. 28, 2015

Related U.S. Application Data

(60) Provisional application No. 62/107,332, filed on Jan. 23, 2015, provisional application No. 62/115,626, (Continued)

(51) Int. Cl.
*H01J 37/30* (2006.01)
*H01J 37/317* (2006.01)
(Continued)

(52) U.S. Cl.
CPC ........ *H01J 37/3172* (2013.01); *H01J 37/244* (2013.01); *H01J 37/3174* (2013.01);
(Continued)

(58) Field of Classification Search
CPC .. H01J 37/244; H01J 37/3171; H01J 37/3172; H01J 37/3174;
(Continued)

(56) References Cited

U.S. PATENT DOCUMENTS

| 5,929,454 A * | 7/1999 | Muraki | H01J 37/3045 |
| | | | 250/491.1 |
| 7,067,809 B2 * | 6/2006 | Lo | B82Y 10/00 |
| | | | 250/310 |

(Continued)

*Primary Examiner* — David E Smith
(74) *Attorney, Agent, or Firm* — Carrington, Coleman, Sloman & Blumenthal, L.L.P.; Seth A. Horwitz

(57) ABSTRACT

Methods, devices and systems for targeted, maskless modification of material on or in a substrate using charged particle beams. Electrostatically-deflected charged particle beam columns can be targeted in direct dependence on the design layout database to perform direct and knock-on ion implantation, producing patterned material modifications with selected chemical and 3D-structural profiles. The number of required process steps is reduced, reducing manufacturing cycle time and increasing yield by lowering the probability of defect introduction. Local gas and photon injectors and detectors are local to corresponding individual columns, and support superior, highly-configurable process execution and control. Targeted implantation can be used to prepare the substrate for patterned blanket etch; patterned ALD can be used to prepare the substrate for patterned blanket deposition; neither process requiring photomasks or resist. Arrays of highly configurable beam columns can also be used to perform both positive and negative tone lithography in a single pass.

20 Claims, 21 Drawing Sheets

Related U.S. Application Data filed on Feb. 12, 2015, provisional application No. 62/151,225, filed on Apr. 22, 2015.

(51) Int. Cl.
*H01L 21/3065* (2006.01)
*H01L 21/308* (2006.01)
*H01J 37/244* (2006.01)

(52) U.S. Cl.
CPC ...... *H01L 21/3065* (2013.01); *H01L 21/3085* (2013.01); *H01J 2237/31708* (2013.01)

(58) Field of Classification Search
CPC ....... H01J 2237/31708; H01L 21/3065; H01L 21/3085; H01L 21/0415; H01L 21/046; H01L 21/425; H01L 21/2253
See application file for complete search history.

(56) References Cited

U.S. PATENT DOCUMENTS

| | | | |
|---|---|---|---|
| 2004/0135102 A1* | 7/2004 | Muraki | B82Y 10/00 250/492.22 |
| 2006/0219944 A1* | 10/2006 | Benveniste | H01J 37/3171 250/492.1 |
| 2008/0075880 A1* | 3/2008 | Renau | H01L 21/2236 427/523 |
| 2009/0149024 A1* | 6/2009 | Huang | H01L 21/0332 438/670 |
| 2010/0248158 A1* | 9/2010 | Chen | B82Y 10/00 430/322 |
| 2012/0164809 A1* | 6/2012 | Yoon | H01L 21/26506 438/303 |
| 2015/0041749 A1* | 2/2015 | Liu | H01L 45/165 257/4 |

* cited by examiner

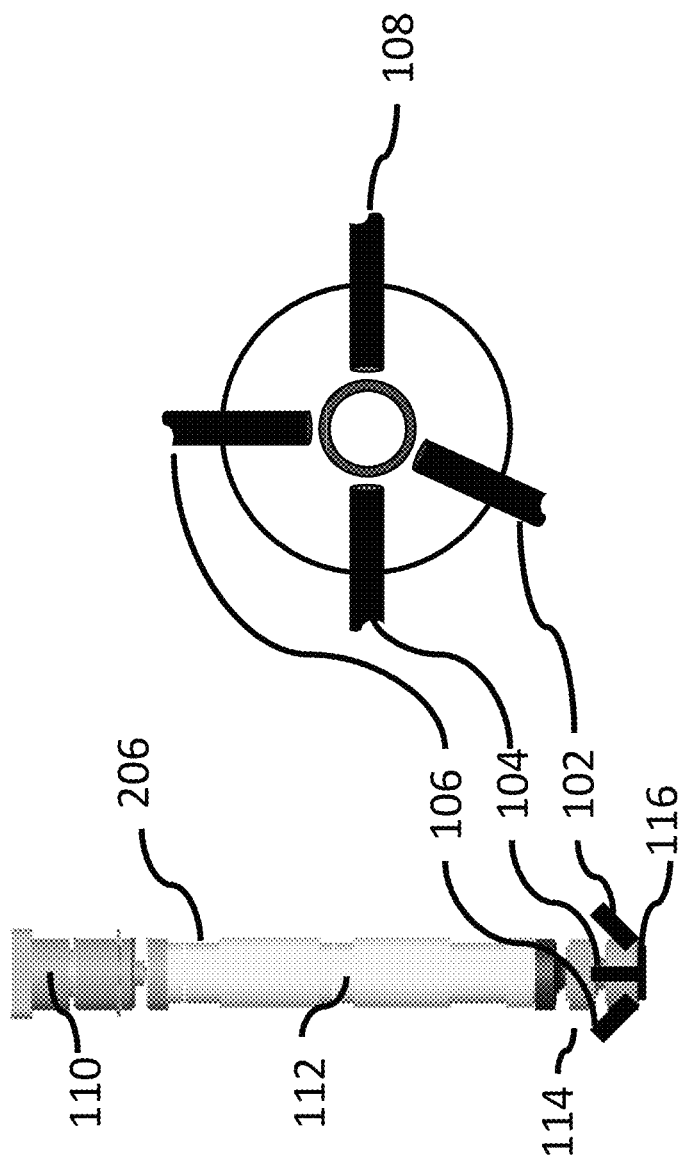

PRECISION MATERIAL MODIFICATION USING MINIATURE-COLUMN CHARGED PARTICLE BEAM ARRAYS

CROSS-REFERENCE

Priority is claimed from, and this application is a non-provisional of, Provisional Pat. App. No. 62/107,332, filed Jan. 23, 2015; Provisional Pat. App. No. 62/115,626, filed Feb. 12, 2015; and Provisional Pat. App. No. 62/151,225, filed Apr. 22, 2015, which are hereby incorporated by reference.

BACKGROUND

The present application relates to systems, devices and methods for maskless material modification on or in substrates using charged particle beams; and more particularly to directly modifying material properties at precise locations as defined in a design layout database using multiple, matched charged particle beams, with the assistance of gas and/or photon injection, and/or of gas and/or photon process control, metrology and endpoint detection.

Note that the points discussed below may reflect the hindsight gained from the disclosed inventions, and are not necessarily admitted to be prior art.

FIG. 2A shows an example of a wafer 200 being scanned by multiple charged particle beams 204 emitted by respective miniature electrostatically-deflected beam columns 206. Individual columns 206 are able to target a portion 202 of the substrate surface 606 with their respectively emitted beams 204.

FIG. 2B shows an example of a wafer 200. Example die 208 size and column 206 center-to-center spacing 210 (column separation) are shown. A regular grid of columns 206 (columns 206 are shown via their center positions, represented here as plusses) can use different spacing 210 in different (generally, orthogonal) directions. Die 208 size and column separation 210 are not required to (and generally, will not) correspond. Column separation 210 generally corresponds to the "writing area" of corresponding columns 206. A column's 206 "writing area" is defined as the substrate area 202 targetable by a charged particle beam 204 emitted from the column 206, taking into account stage movement.

The multiple column 206 array comprises miniature (small enough to fit multiple columns in an array) charged particle beam columns 206 arranged in a regular grid. For example, column 206 arrays with center-to-center column spacing 210 of 30 mm×30 mm have been implemented, though other column spacings 210 (e.g., 24 mm×33 mm) can also be used.

A stripe is the portion of the wafer 200 surface that a charged particle beam can target while the stage is moving predominantly in a single direction, i.e., before the stage moves laterally and switches predominant directions to give the beam access to a different stripe. A "frame" is defined herein as the portion of the wafer surface that a beam can target at a given time, corresponding to the main-field deflection area at that time, as designated by the design layout database. A frame is typically designated to be rectangular, for convenience (e.g., to tile the writing area); and smaller than the furthest extent to which the beam can be deflected (e.g., to preserve beam targeting accuracy).

"1-D" refers to 1-D gridded design rule. In a 1-D layout, optical pattern design is restricted to lines running in a single direction, with features perpendicular to the 1-D optical design formed in a complementary lithography step known as "cutting". The complementary step can be performed using a charged particle beam lithography tool comprising an array of columns 206—for example, electrostatically-controlled miniature electron beam columns 206. A 1-D layout is separated in the design layout database into a "line pattern" and a "cut pattern". The design layout database contains the information needed by lithography tools to pattern one or more layers on a substrate 604. A line pattern generally comprises an array of unidirectional lines. Cut patterns generally comprise line-cuts and holes ("cut features").

Generally, line patterns are written by an optical lithography system, which can be followed by other process steps to increase the density of lines on the substrate 604. Cut patterns are written by a complementary (generally higher-resolution) process, such as electron beam lithography. Use of electron beam lithography for this complementary process is also called complementary e-beam lithography, or CEBL. The combination of the line-forming process followed by line-cuts written with CEBL to pattern a substrate layer is called complementary lithography.

FIG. 2C shows an example of a prior art process for modifying material on (or in) a substrate 604 using ion implantation.

Typically, as shown in FIG. 2C, a design layout database is used to designate where on a substrate material should be modified 212 (e.g., to form transistor active areas through ion implantation). One or more optical masks are fabricated based on the design layout database 214 using a mask making tool 216. Fabrication of an optical mask set (multiple masks) typically takes weeks and costs millions of dollars at advanced process nodes.

"Blanket" deposition and etch (or other process) generally refers to deposition and etch (or other process) on the entire surface 606 of the substrate 604.

"Resist" refers herein to a class of materials used in substrate lithography. When a resist is deposited on a substrate 604 and exposed to an energy source corresponding to the type of resist (e.g., photons for a photoresist) in a chosen pattern, its chemical properties change (e.g., causing cross-linking between or dissociation of resist molecules) such that when the resist is developed (in ways similar to developing a photographic film), a portion of the resist corresponding to a positive or negative image of the pattern (depending on the type of resist) will remain, allowing the pattern to be expressed in the material underlying the resist, e.g., using etch steps. Portions of a positive tone resist which have been exposed to a corresponding energy source become soluble to and will be removed by a corresponding developer. Portions of a negative tone resist which have been exposed to a corresponding energy source become insoluble to a corresponding developer, which will remove the unexposed portions of the negative tone resist.

A photoresist layer is blanket deposited on the substrate surface 606 in step 218 by a resist deposition tool 220. The photoresist is then exposed using the optical mask(s) 222 by an optical lithography tool 224. The exposed portion of the resist layer (as designated by the optical mask(s)) is removed 226 using a resist developing tool 228, and the resulting patterned resist layer is inspected for defects and process control metrology (After Develop Inspection (ADI) and metrology) 230 by an inspection tool 232.

The substrate surface 606 is then blanket modified 234 (using ion implantation), through the pattern expressed in the resist layer by steps 222 and 226, using an ion implantation tool 236 to express (substantially) the same pattern in the underlying material. The resist layer is then removed 238 by a resist removal tool 240. One of ordinary skill in the arts of charged particle beam material modification will understand that other and/or additional steps can be used in a conventional ion implantation process.

$T_i$ represents the amount of time added by a corresponding process step. $Y_i$ represents the yield impact of a corresponding process step (one minus probability of introducing one or more yield-reducing defects). Where T is the total time taken by a material modification process, and Y is the expected yield following a material modification process:

$$T=\Sigma_{i=1}^{N}T_i \quad \text{Equation 1:}$$

$$Y=\Pi_{i=1}^{N}Y_i \quad \text{Equation 2:}$$

Numerous steps in conventional semiconductor lithography material modification processes are expensive and time consuming, and potentially introduce defects into the desired pattern, lowering yield. Process-induced defects can be introduced by, for example, wafer handling, resist spin and heating, lithography, resist development, inspection, implantation and thermal processing.

SUMMARY

The present application discloses new approaches to systems, devices and methods for precision modification of material on or in a substrate using multiple miniature charged particle beam columns variously configurable to directly modify such materials without a pre-patterned resist layer.

In particular, the inventors have discovered that modification using charged particle beam columns can be significantly accelerated by using local gas and/or photon injectors fixedly located with respect to corresponding ones of the columns, and proximate, oriented towards and having line of sight to corresponding ones of the frames.

The inventors have also discovered that local photon detectors and gas detectors, situated locally to and collecting data directly from beam target locations, can be used to monitor and provide feedback to control of charged particle beam columns performing material modification processes, including for example process endpoint detection.

Material modification can enable, improve or comprise, for example, ion implantation (knock-on or directly implanting beam ions) and dual-tone photoresist writing (writing both positive and negative resist simultaneously).

Preferred embodiments of miniature column charged particle beam material modification include direct material modification, control and inspection processes that can work directly and automatically from the SAME design layout database. In some embodiments, these and other processes can be implemented together within a single modular tool, allowing targeted modification of entire layers without breaking vacuum.

Direct material modification processes can be used to replace conventional apply resist-expose resist-develop resist-modify material lithography processes to eliminate numerous lithography steps, increase throughput and dramatically increase yield.

BRIEF DESCRIPTION OF THE DRAWINGS

The disclosed inventions will be described with reference to the accompanying drawings, which show important sample embodiments and which are incorporated in the specification hereof by reference, wherein:

FIG. 1 schematically shows an example of a charged particle beam column.

DETAILED DESCRIPTION OF SAMPLE EMBODIMENTS

Figure 2A:
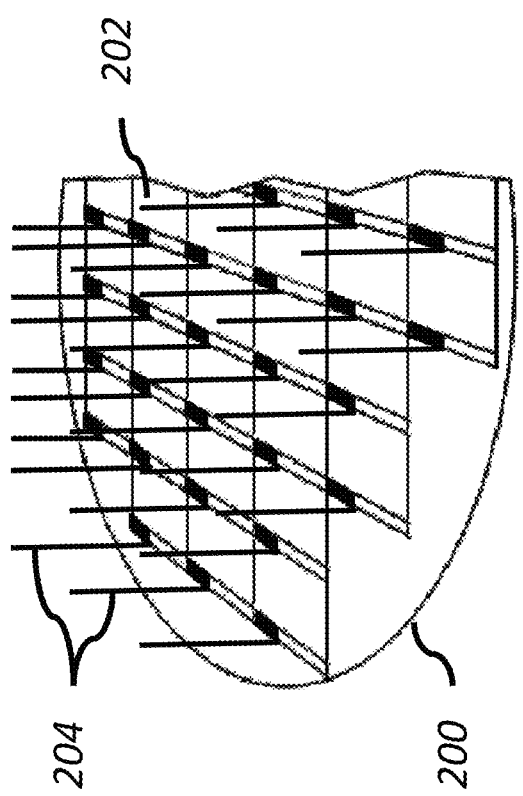
FIG. 2A shows an example of a wafer being scanned by multiple charged particle beams emitted by respective beam columns.
Figure 2B:
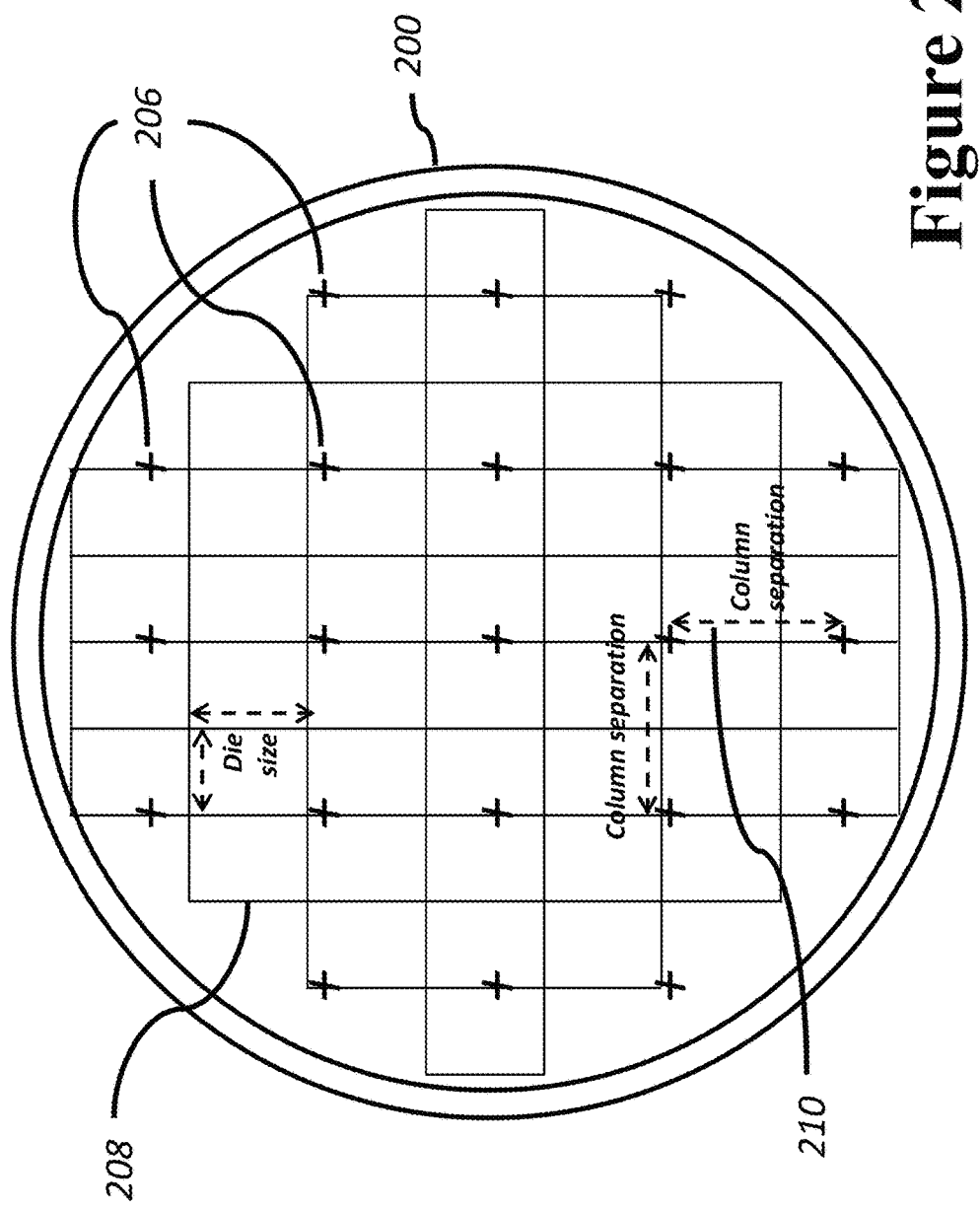
FIG. 2B shows an example of a wafer.

The numerous innovative teachings of the present application will be described with particular reference to presently preferred embodiments (by way of example, and not of limitation). The present application describes several inventions, and none of the statements below should be taken as limiting the claims generally.

The present application discloses new approaches to systems, devices and methods for precision modification of material on or in a substrate using multiple miniature charged particle beam columns variously configurable to directly modify such materials without a pre-patterned resist layer.

In particular, the inventors have discovered that modification using charged particle beam columns can be significantly accelerated by using local gas and/or photon injectors fixedly located with respect to corresponding ones of the columns, and proximate, oriented towards and having line of sight to corresponding ones of the frames.

The inventors have also discovered that local photon detectors and gas detectors, situated locally to and collecting data directly from beam target locations, can be used to monitor and provide feedback to control of charged particle beam columns performing material modification processes, including for example process endpoint detection.

Material modification can enable, improve or comprise, for example, ion implantation (knock-on or directly implanting beam ions) and dual-tone photoresist writing (writing both positive and negative resist simultaneously).

Preferred embodiments of miniature column charged particle beam material modification include direct material modification, control and inspection processes that can work directly and automatically from the SAME design layout database. In some embodiments, these and other processes can be implemented together within a single modular tool, allowing targeted modification of entire layers without breaking vacuum.

Direct material modification processes can be used to replace conventional apply resist-expose resist-develop resist-modify material lithography processes to eliminate numerous lithography steps, increase throughput and dramatically increase yield.

The disclosed innovations, in various embodiments, provide one or more of at least the following advantages. However, not all of these advantages result from every one of the innovations disclosed, and this list of advantages does not limit the various claimed inventions.

Enable rapidly patterning a material without resist and without deposited hard mask;
enable rapidly modifying material in a pattern layer WITHOUT PHOTOMASKS;
improve yield;
faster manufacture of semiconductor and other substrate devices;
lower cost of manufacture of semiconductor and other substrate devices;
faster design to manufacturing process;
lower cost of design to manufacturing process;
faster per-layer patterning cycle;
lower cost of per-layer patterning cycle;
lower aggregate tool cost to pattern a substrate layer;
fewer tools required to pattern a substrate layer;
enhance patterning tool configurability;
decrease chemical usage of material in modification processes;
decrease environmental impact of material in modification processes;
enable patterning, pattern inspection, defect identification and pattern repair without breaking vacuum;
material modification is LOCALIZED to (and in some embodiments, by) material affected by charged particle beams; and
fewer substrate transfers between process tools.

Some exemplary parameters will be given to illustrate the relations between these and other parameters. However it will be understood by a person of ordinary skill in the art that these values are merely illustrative, and will be modified by scaling of further device generations, and will be further modified to adapt to different materials or architectures if used.

"Substrate" 604 is defined herein as a workpiece having a composition and shape amenable to patterning and modification of one or more layers of material thereupon using techniques applicable to semiconductor device fabrication, such that functional devices can be produced therefrom.

As used herein, "writing" a substrate 604 refers to any process which expresses specified pattern in or on the substrate 604 (including material deposited on the substrate surface 606), expressed through any physical or chemical property of said substrate 604 or deposited material. With respect to charged particle beams 204 targeted in direct dependence on a design layout database, "writing" includes, for example, "material subtraction" as disclosed in U.S. patent application Ser. No. 14/694,710, "material addition" as disclosed in U.S. patent application Ser. No. 14/745,463, "direct ALE" and "direct ALD" as disclosed in U.S. patent application Ser. No. 14/966,165, and "direct material modification".

"Direct material modification" is defined herein as modification of chemical or compositional properties of material on or in a substrate 604 using one or more electrostatically-deflected charged particle beams 204 targeted in direct dependence on a design layout database; said direct material modification comprising at least some such modification localized to material directly affected by said beams 204, and comprising at least some intended (not incidental) modification of material immediately following said direct affect by said beams 204. Modified material can comprise, for example, chemically, electrically, mechanically, thermally, optically, magnetically, fluidically, structurally or biologically functional material (such as semiconductor wafer or other substrate material), or hard mask, resist or other process-related material.

The present application is directed to, for example, factory-integrated use of systems comprising multiple miniature charged particle beam columns 206 to create nanometer-scale patterns on semiconductor wafers 200 or other substrates 604. Arrays of heavily configurable, miniature, electrostatically-controlled columns 206 can be used to pattern wafers 200 and other substrates 604 directly, without masks, without resist, and without previous lithographic steps. Such systems can be used to achieve massively parallel substrate processing and to reduce stage travel per layer (or other cycle measure) of processing.

Embodiments disclosed herein enable precision processing of materials and, in particular, targeted modification of materials common in the processing of semiconductor wafers 200 and other electrically, magnetically, optically, mechanically, chemically, or biologically active substrates 604. Such substrates 604 can comprise, for example, workpieces used in fabrication and repair of light emitting diodes (LEDs), giant magnetic resonance (GMR) structures used in thin-film heads, opto-electronic devices (OEDs) used for switching, micro-electro-mechanical systems (MEMS) structures, photonic metamaterials, and patterned substrates 604 used for chemical analysis and genetic sequencing.

For example, direct material modification can be performed using one or more multi-column charged particle beam systems 1000 using ion implantation (direct or knock-on implantation) or dual-tone lithography. These processes can be used alone, or in concert with other modification techniques or other substrate processing techniques. Direct material modification processes can be performed either sequentially or simultaneously by multiple columns 206 in an array 1002, and different columns 206 in an array 1002 can be configured and/or optimized to perform the same direct material modification (or other) process, or different direct material modification processes (or other processes, e.g., inspection and metrology).

Direct material modification can create a layer of pattern specified by the design layout database in its entirety or in a complementary fashion with other patterning processes. For example, direct material modification can be used to prepare substrates for selective material deposition or etching; or to add to, subtract from or modify structures produced by optical lithography (or by other substrate processing techniques); or to add new physical and/or compositional structures.

In preferred embodiments, the array 1002 of charged particle beam columns 206 is stationary, the stage holding the wafer 200 moves back and forth, and individual charged particle beam columns 206 move (deflect) the corresponding beam 204 across the wafer 200 to perform direct material modification.

Preferably, beam motion across the wafer 200 (or other substrate 604) comprises vector-raster scanning while writing on a substrate (e.g., vector scanning to a registration mark, raster scanning the registration mark, and then vector scanning to write each cut feature) or vector-raster scanning while imaging a substrate (e.g., vector scanning to a target feature or "care-area" containing a target feature, and raster scanning across the target feature). Preferably, each column 206 has its own local (short communication path) control computer. Vector-raster scanning, care-areas, and use of multiple control computers local to respective columns 206 are disclosed in U.S. patent application Ser. No. 14/085,768, which is incorporated herein by reference. (As will be apparent to one of ordinary skill in the arts of charged particle beam substrate processing, "care-areas" can be adapted for use as approximately minimally-sized regions containing target locations for irradiation for various purposes in addition to defect identification.) These control methodologies enable areas of interest to be irradiated, while efficiently avoiding areas where direct material modification (or other charged particle beam function) is not required.

Rapid pattern alignment and registration with superior accuracy (e.g., for minimizing pattern overlay error) can be achieved using imaging targets generated using Hadamard and/or Walsh functions as disclosed in, for example, U.S. patent application Ser. No. 14/522,563, which is incorporated herein by reference.

High beam current can be maintained by minimizing charged-particle crossovers in the columns 206, reducing current-limiting Coulomb effects.

The design layout database is preferably partitioned to designate which column 206 will perform the work for the corresponding substrate writing area. Preferably, writing areas have the same size as column-to-column spacing 210.

In preferred embodiments, different columns 206 can perform direct material modification (and/or other processes, such as imaging, depending on configuration) on a patterned or unpatterned substrate 604 differently and independently, with beam deflection parameters determining targeted beam landing position based directly (though generally not only; e.g., tool parameter settings are also typically used, and identified areas of interest can be considered, as mentioned above) on a previously-partitioned design layout database used by various column functions (e.g., both material modification and inspection functions). Use of multiple columns 206 to independently and simultaneously write and/or image a substrate 604, both based directly on the same previously-partitioned design layout database, is disclosed in, for example, U.S. Pat. No. 8,999,627, which is incorporated herein by reference.

As used herein, sets of multiple beam columns being "substantially the same" means that the sets of multiple beam columns comprise arrays of multiple miniature, electrostatically-driven columns with identical column-to-column spacing, and identical type of beam deflection (electrostatic) and of focus mechanisms.

For stages, "substantially the same" means identical or nearly identical with respect to substrate-stage alignment mechanisms, stage positioning mechanisms, stage position accuracy, and control electronics and software. "Nearly" identical means that the variations can include, for example, year-to-year improvements in design or manufacturing techniques, or incremental improvements or optimizations to a design, which can result in two stages being "substantially the same" but not identical. However, major changes in design approach will break substantial sameness.

As used herein, "matched" columns 206 means that columns 206 are "substantially the same", and stages are "substantially the same". Generally, different matched columns 206 are able to process corresponding different writing areas of a substrate 604 similarly (preferably, nearly identically); and different arrays of matched columns 206, irradiating different substrates carried by different stages that are substantially the same, are able to process the different substrates 604 similarly (preferably, nearly identically). Embodiments disclosed herein preferably use matched columns 206.

Fully automated beam targeting based directly on a design layout database is preferred. Beam targeting "based directly on a design layout database" is defined to mean that during patterning, local column controllers automatically access portions of the design layout database relevant to corresponding writing areas and interpret the design layout database directly into beam column control instructions for immediate use specifying beam deflection, beam dwell timing, beam blanking timing, beam shape and/or beam landing energy.

Columns 206 can be configured such that different columns 206 use different physical and chemical processes for direct material modification.

Beam column parameters and other parameters can be independently and automatically optimized per-column based on automatically analyzed images taken of direct material modification results. Automatic image analysis and column parameter optimization are disclosed in, for example, U.S. Pat. No. 8,999,628, which is incorporated herein by reference.

One of ordinary skill in the arts of charged particle beam material modification will recognize that a wide variety of other control options are available per-column 206.

Preferably, photon injectors 104 and detectors 108, and gas injectors 102 and detectors 106, as described below are "miniature"; that is, they are small enough to position (preferably, fixedly) at or near the bottom of a column 206 (preferably, attach to the column 206 and/or thread through its casing) whichever of said injectors and detectors 102, 104, 106, 108 are required by the embodiment, such that the injector or detector 102, 104, 106, 108 (and particularly the corresponding emitter or collector portion thereof) is located to permit function as described herein.

FIG. 1 schematically shows an example of a charged particle beam column 206 configured for material modification. Preferably, an array 1002 of such columns 206 (which can be individually customized to the particular processes to be respectively executed) is used to perform direct material modification (as disclosed with respect to, e.g., FIGS. 3A, 3C through 5B, and 10).

As used herein with respect to a gas or photon injector or detector 102, 104, 106, 108, "local" (also "Local" and "LOCAL") is defined as: mounted in a fixed position with respect to a corresponding one of multiple columns 206, the active emitting or collecting component(s) of said injector or detector 102, 104, 106, 108 having line of sight to and oriented towards the main-field deflection area 610, said active component(s) at least partially contained within the perimeter of the column 206.

An active emitting or collecting component(s) is the optical lens, gas inflow or outflow opening, or kinetic lens 602 that for the respective local injector or detector 102, 104, 106, 108 last emits gas particles or photons towards, or first collects gas particles or photons from, the corresponding main-field deflection area 610. Preferably, said active component(s) is as close as practical to the center of the column's 206 primary axis and to the substrate surface 606 without impacting the substrate surface 606, and without compromising column function (e.g., electrical characteristics of the column 206) or the focus area of the active component(s). Greater proximity is preferred, for example, to preserve collimation or focus, and for gas and photon collection effectiveness, selectivity and efficiency.

Except where stated otherwise, gas and photon injectors 102, 104 and detectors 106, 108 described with respect to the various embodiments disclosed herein are local. Direct material modification using multiple miniature charged particle beam columns 206 is enabled by the use of LOCAL gas and/or photon injectors and/or detectors 102, 104, 106, 108 as disclosed herein.

Local gas injectors 102 and/or local photon injectors 104 can be used to greatly increase rates of charged particle beam direct material modification processes such as ion implantation or cross-linking and dissociation; in some embodiments, sufficiently to provide throughput compatible with in-line fabrication processes. Further, as discussed with respect to, e.g., FIGS. 3A, 3B and 3C, preferred embodiments provide significant yield advantages.

Local photon detectors 108 enable real time detection of spatially localized processes: generally, localized per-column 206 to individual frames 610. Features can be modified to the correct geometries, e.g., neither shallower nor deeper than desired.

FIG. 1 schematically shows an example of a charged particle beam column 206 configured for material modification, comprising: a charged particle beam gun 110 (an ion gun or electron beam gun, respectively), including a charged particle source (an ion or electron source, respectively), aperture and electrostatic lens; a deflection assembly 112 for blanking the charged particle beam 204, deflecting the charged particle beam trajectory, and/or modifying the charged particle beam shape (blanking, deflecting or reshaping the ion or electron beam 204, respectively); a main lens 114, for focusing the charged particle beam (ion or electron beam 204) or adjusting the beam size at the substrate plane; one or more local gas injectors 102, for increasing partial pressure of process-critical gasses (e.g., gasses providing ions for knock-on), creating oxidizing or reducing environments, or for creating other or additional advantageous chemical environments within the main-field deflection area 610; one or more local photon injectors 104; a local gas detector 106; one or more local photon detectors 108; and an electron detector 116, e.g., to detect secondary electrons or ions, and/or backscattered electrons or ions for CD metrology or overlay and localized process monitoring.

Preferably, configuration of individual columns 206 (e.g., in an array 1002, whether and which of, e.g., local injectors and/or detectors 102, 104, 106, 108 are assembled onto individual columns 206 in the array 1002) can be altered based on the particular intended application.

Direct material modification can comprise one or more of (for example) ion implantation or electron-induced cross-linking or dissociation of polymers. Material modification, including direct material modification, can be used to modify various material bulk or surface properties.

A local gas injector 102 can be used to increase the partial pressure of process gasses within a main-field deflection area 610 significantly (e.g., by multiple orders of magnitude) relative to the average ambient pressure in the vacuum chamber, while having minimal effect on process gas concentration at other main-field deflection areas 610 (corresponding to other columns 206). A kinetic lens 602 (further described below with respect to, e.g., FIGS. 6A, 6B, 6C, 6D and 6E) connected to a local gas injector 102 to collimate or focus the gas injector's 102 output on an area of the substrate surface containing the main-field deflection area 610 of a corresponding column 206 further significantly raises consistently achievable partial pressures (in some embodiments, by multiple orders of magnitude). These large increases in partial pressures of advantageous gasses in a main-field deflection area 610—and thus, at the corresponding charged particle beam impact location—can significantly raise the direct material modification process rate (in some embodiments, by multiple orders of magnitude).

Generally, gas flow rate can be calculated ahead of time and depends on several parameters, including the particular process to be used (and its required and/or desired chemistry), local temperature (which can be controlled to be substantially constant, within an acceptable range depending on the particular process), the design layout database, and charged particle beam current (which can be constant). If necessary, changes to gas flow parameters during a material modification process can be made based on feedback from local detectors.

In a preferred embodiment, gas flow rate is kept above a pre-determined threshold such that supply of gas precursors is not limiting.

A local photon injector 104 is preferably a light source optically connected by an optical fiber to a lens.

Local photon injectors 104 emitting infrared (IR) photons can be used to precisely raise the temperature of the substrate at the beam impact location to optimize temperature conditions for the corresponding charged particle beam modification process without overheating the substrate as a whole. This generally allows a higher temperature at the frame than would be desirable for the entire substrate, and allows IR photon flux to be maintained at levels that increase the rate of adsorption, but are below levels that induce spontaneous etching (in some embodiments, orders of magnitude greater IR photon flux than could desirably be obtained using blanket illumination).

Preferably, the lens focuses the IR photons on a minimal area containing the main-field deflection area 610. In some embodiments, temperature optimization can be used to increase substrate surface material adsorption rate of process gasses (higher process-critical gas adsorption rate typically correlates to shorter cycle times for direct material modification processes using gas injection); or to modify resultant material surface properties (e.g., surface texture). Using temperature measured within a known small area containing the beam impact location (e.g., a minimal area containing the main-field deflection area 610), preferably using a local photon detector 108, temperature at the beam impact location can be approximated. In some embodiments (e.g., embodiments limited by substrate surface adsorption rate of process-critical gasses), by optimizing said temperature conditions, direct material modification process cycle times can be significantly reduced.

Desired local temperatures for individual columns 206 can be determined prior to starting a direct material modification process, depending on, for example, the design layout database and characteristics of the particular process (es) to be used. Feedback from local temperature measurement can then be used to control brightness and other characteristics (e.g., pulse rate, pulse duration) of the photon injector 102 to precisely control the local temperature of the substrate 604.

Local photon injectors 104 can also be used to shine photons, with wavelength(s) appropriate to one or more substrate surface materials (or adsorbed process gasses), on the main-field deflection area 610 to modulate surface reaction rates; certain types of direct material modification processes can be further accelerated by exciting substrate surface material (or adsorbed process gasses) electrons to a higher energy state. UV photon energies can be matched to the bond energies of reactant species. For example, deep UV is characteristic for photochemistry of various materials. Local UV photon injectors can provide illumination intensity near a reaction site that is orders of magnitude greater than could be desirably obtained by blanket illumination of the vacuum chamber surrounding a column array 1002.

Figure 7:
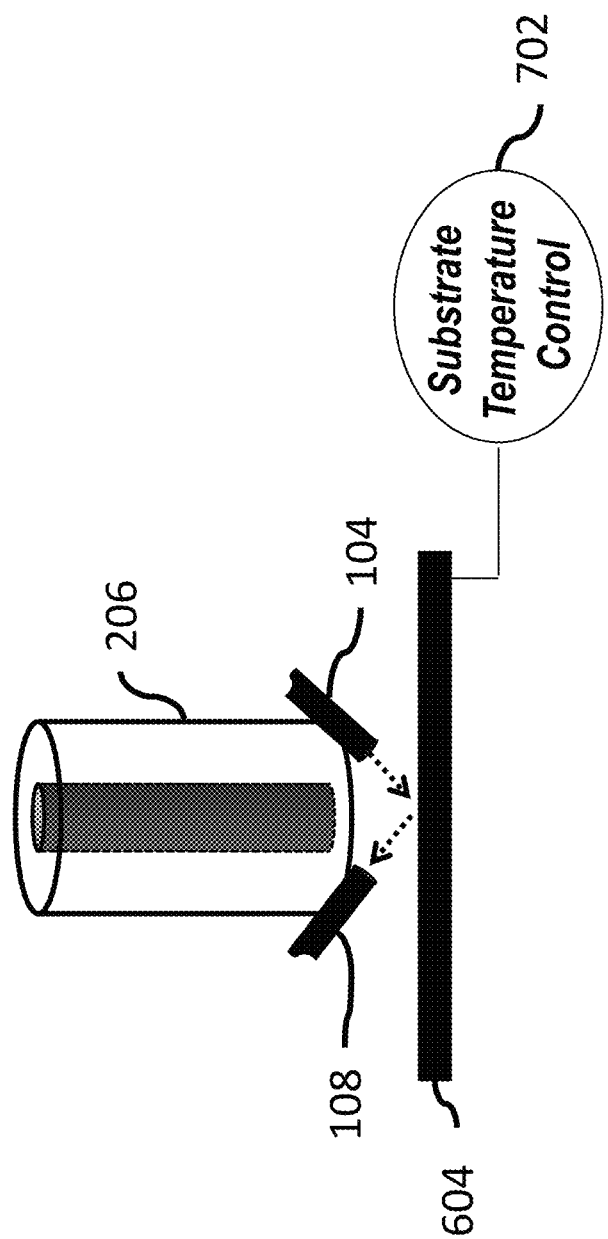
FIG. 7 schematically shows an example of a photon injector and a photon detector mounted on a charged particle beam column.

Local photon injectors 104 can also be used to shine photons on the substrate surface material to perform various analyses (process monitoring) of substrate surface material, e.g., polarimetry, reflectometry and/or interferometry. For example, the intensity of reflected injected photons depends on changes in the optical constants of a material modified by ion implantation. Preferably, a local photon detector 108 is arranged to collect as many of the reflected photons as possible to optimize the efficacy of such analyses, as shown in FIG. 7. Such photons can generally be of any wavelength, within limits set by available optics and other physical properties.

Endpoint detection refers herein to using detectors to determine when a direct material modification process (bulk and/or surface material property modification) has been completed for a particular frame 610 (e.g., when a desired dopant concentration has been reached). As an ongoing direct material modification process modifies bulk or surface substrate properties, the properties of the modified material increasingly influence measurements of substrate surface 606 properties. Substrate surface 606 material properties (e.g., interferometry results), and rates of change and higher-order derivatives of indicated properties, can be used to accurately determine and/or predict process endpoints.

Process monitoring refers herein to analysis of detected material properties to determine process accuracy and/or produce process performance metrics. Process monitoring can be used to provide process feedback (e.g., to local control computers) that enables process adjustments (e.g., precursor gas flow or beam parameter adjustments, or automatic design layout database modification). Process feedback can occur during, and/or resulting process adjustments can be made for, the frame 610 in which corresponding photons or gas particles were collected, or one or more subsequent frames 610, or one or more subsequent processing cycles (e.g., for a subsequent layer, or for a subsequent substrate).

Local gas detectors 106 can be used for process monitoring, e.g., to monitor localized gas composition.

Local photon detectors 108 can be used to detect photons reflected or emitted from the substrate surface 606 near the beam impact location. Detected photons can be used to perform, for example, polarimetry, reflectometry, interferometry, or optical emission spectroscopy on substrate surface material. Substrate surface material properties indicated by such measurements generally include polarization, reflectivity, optical interference, temperature and material composition. Substrate surface material properties, and rates of change and higher-order derivatives of indicated properties, can be used to determine process endpoints, monitor process reaction rates, to monitor the temperature at (or in the vicinity of) the corresponding charged particle beam target impact location, to determine material modification rate, and for other process monitoring analyses.

Different columns 206 can be configured and/or optimized to perform different (or multiple) types of direct material modification processes or other material processing, e.g., some columns 206 can be configured to perform direct material modification, while other columns 206 are configured to perform imaging (e.g., for alignment, registration and/or wafer inspection). The wide range of per-column 206 configurability disclosed herein means that beam columns 206 can be adapted to and optimized for a wide variety of substrate processing applications.

Figure 3A:
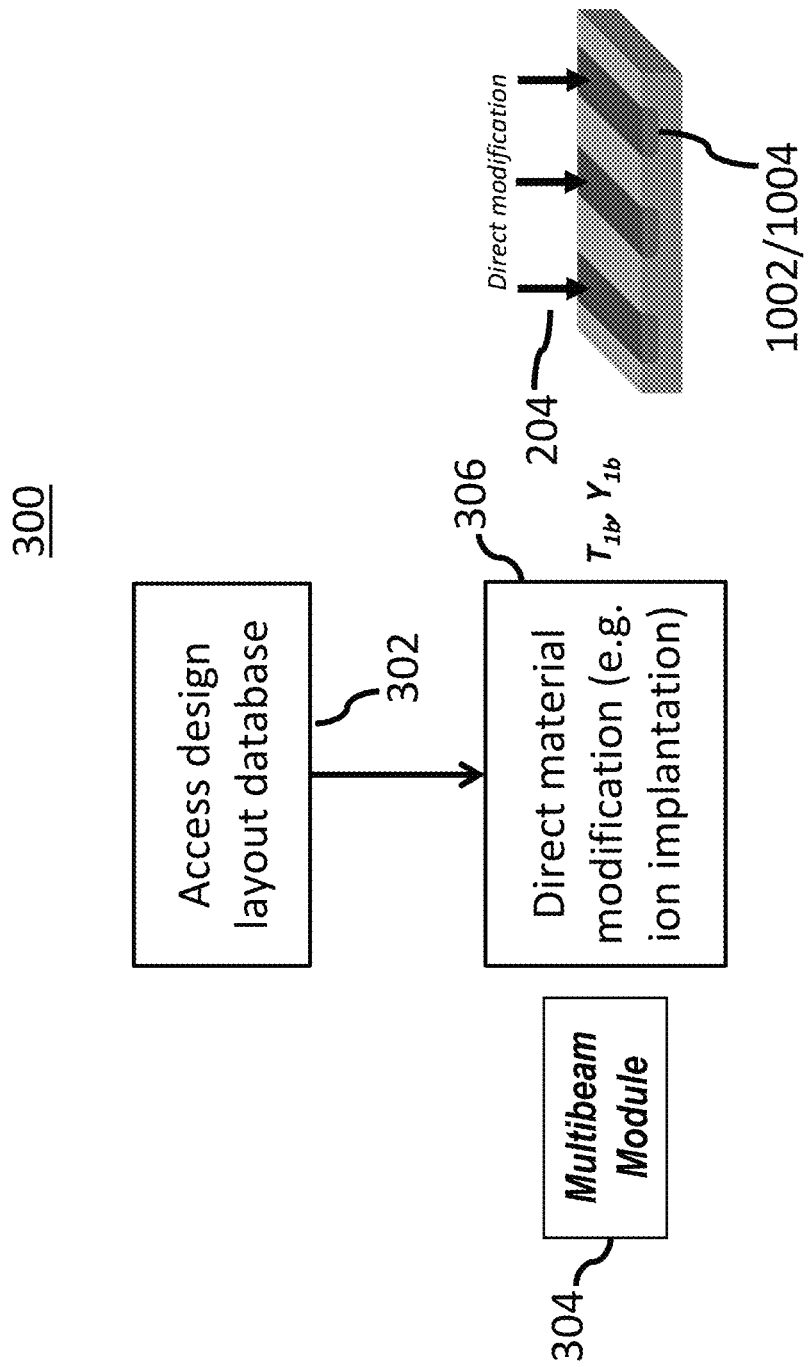
FIG. 3A shows an example of a direct material modification process.

FIG. 3A shows an example of a direct material modification process 300 WITHOUT A PRE-PATTERNED RESIST LAYER (some such processes can comprise modifying a resist layer). A design layout database is used to designate where and how material will be modified 302 in and on a substrate 604. A multibeam module 304 (e.g., a charged particle beam system 1000 or charged particle beam module 1102) is then used to perform direct material modification (e.g., ion implantation) to directly modify material in a pattern designated by the design layout database, using local gas and/or photon injectors 102, 104, and/or local gas and/or photon detectors 106, 108 in step 306. Example results of a direct material modification process 300 using (knock-on or direct) ion implantation are also shown in FIG. 3A (uniform-profile 902 doped regions are shown; differentiated-profile 904 doped regions can also be produced).

Figure 2C:
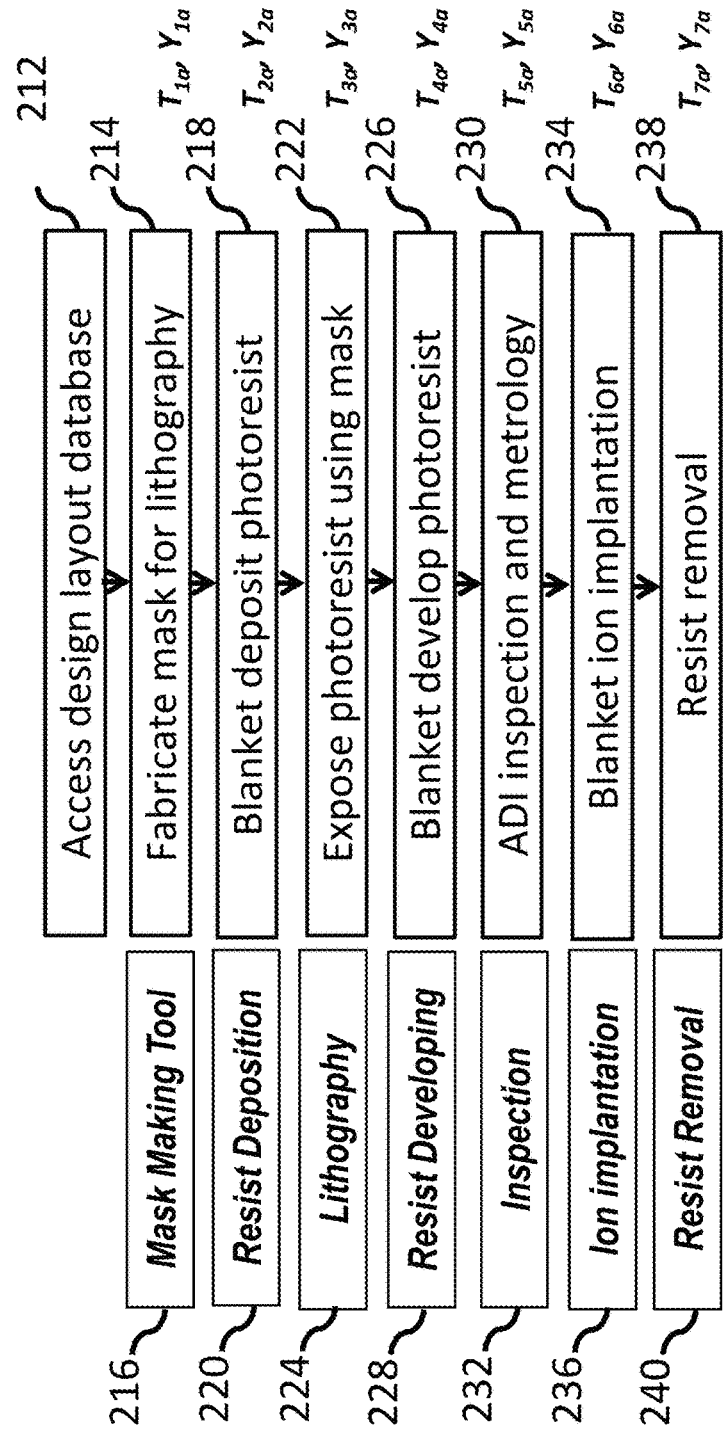
FIG. 2C shows an example of a prior art process for modifying material on a substrate.

The direct material modification process embodiment(s) shown in FIG. 3A dramatically reduces the number of steps required for precise, patterned substrate (body or surface) material modification—and, concomitantly, removes a wide variety of collateral sources of process-induced error, such as a large number of transitions between process tools—with respect to the prior art process embodiment(s) shown in FIG. 2C. See Equations 1 and 2.

Consequently, manufacturing cycle time can be reduced and device yield can be increased using direct material modification with local injectors and detectors 102, 104, 106, 108 as disclosed herein.

Figures 3B, 3C:
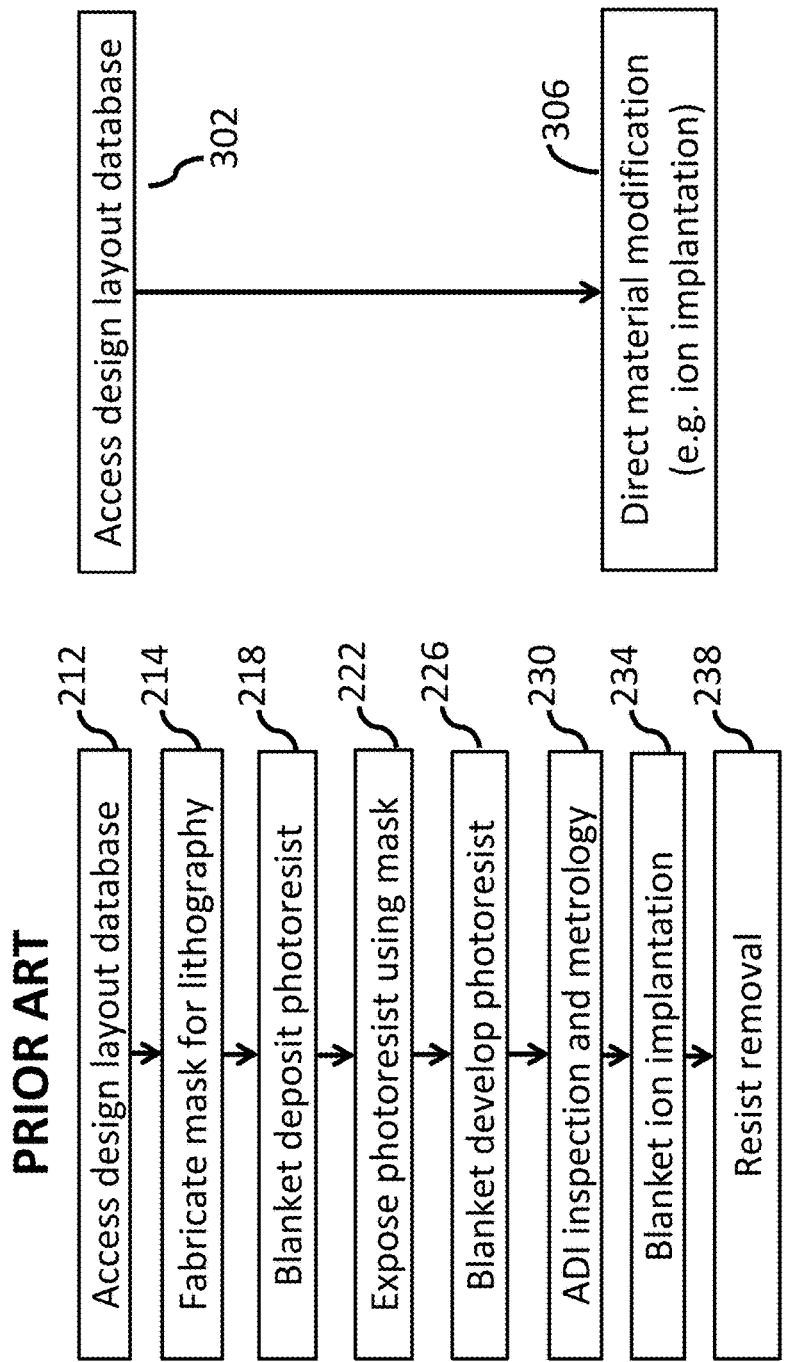
FIG. 3B shows an example of a prior art material modification process.
FIG. 3C shows an example of a direct material modification process.

FIG. 3B shows an example of a prior art substrate material modification process (see FIG. 2C). FIG. 3C shows an example of a direct material modification process (see FIG. 3A).

Comparison between the prior art embodiment(s) of FIG. 3B and the innovative embodiment(s) of FIG. 3C helps to clarify the dramatic process simplification, and improvement in efficiency and yield potential, achieved by using multiple (preferably a large array 1002 of) miniature electrostatically-controlled charged particle beam columns 206, together with corresponding local gas and photon injectors and detectors 102, 104, 106, 108, to perform material modification.

Simultaneous, independent control of multiple charged particle beams and local gas injectors (and preferably local IR and/or UV photon injectors) allows a high degree of process control, e.g., deliberate intra-wafer and intra-die variation (including per-pass variation).

Figure 4A:
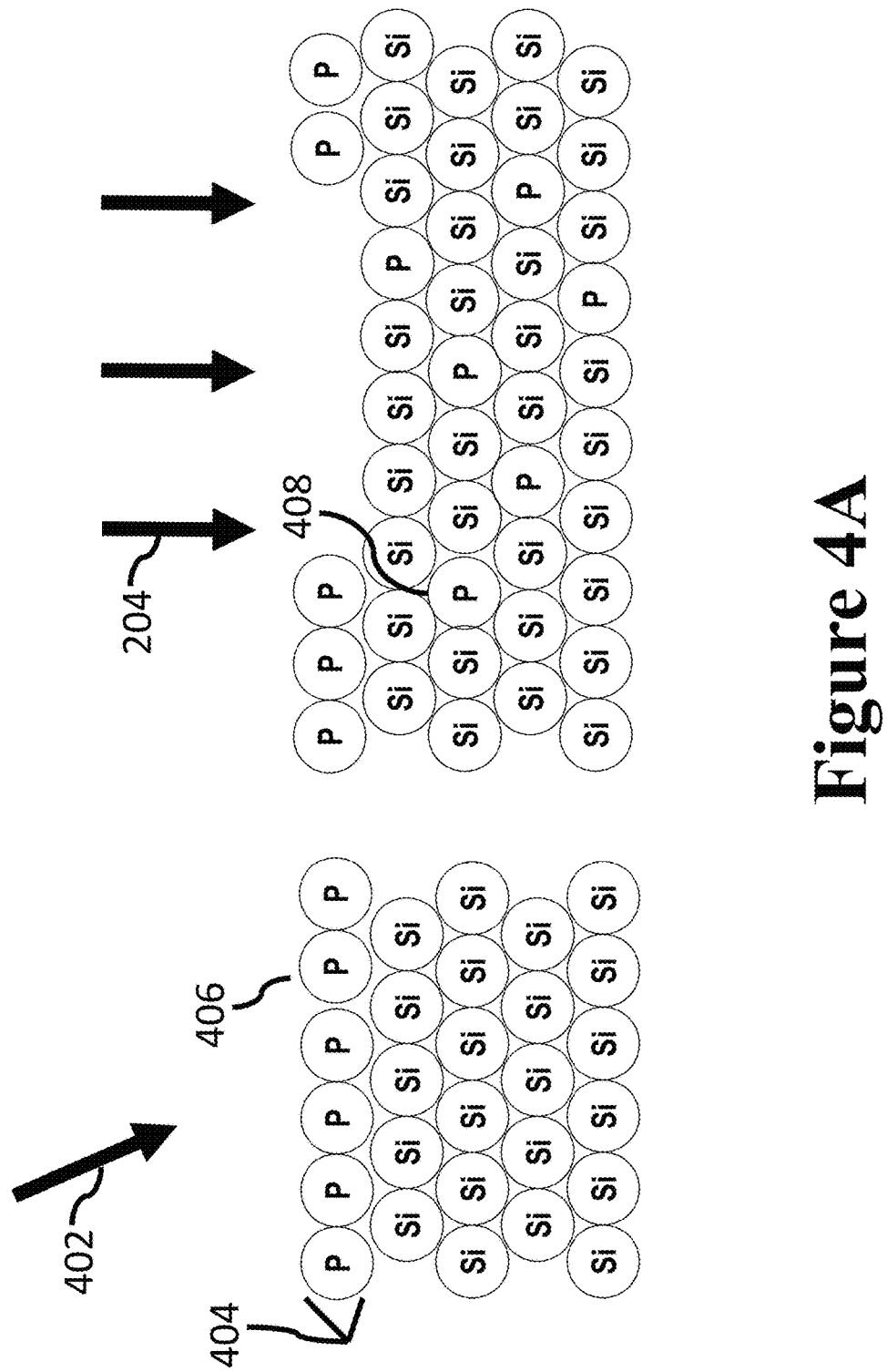
FIG. 4A shows an example of a direct material modification process using knock-on implantation.

FIG. 4A shows an example of a direct material modification process using knock-on implantation. In knock-on implantation embodiments as shown in FIG. 4A, ions to be implanted (in FIG. 4A, potassium ions) are introduced 402 by one or more local gas injectors 102, and become available 404 at the substrate surface 606 through dissociative adsorption of one or more dopant species components of the injected gas. A charged particle beam 204, preferably an ion beam, "knocks" dopant ions 406 into 408 the substrate 404 using energetic impact, with implantation depths depending on beam energy (FIGS. 4A and 4B are for illustration only and generally do not reflect actual implantation depths).

Figure 4B:
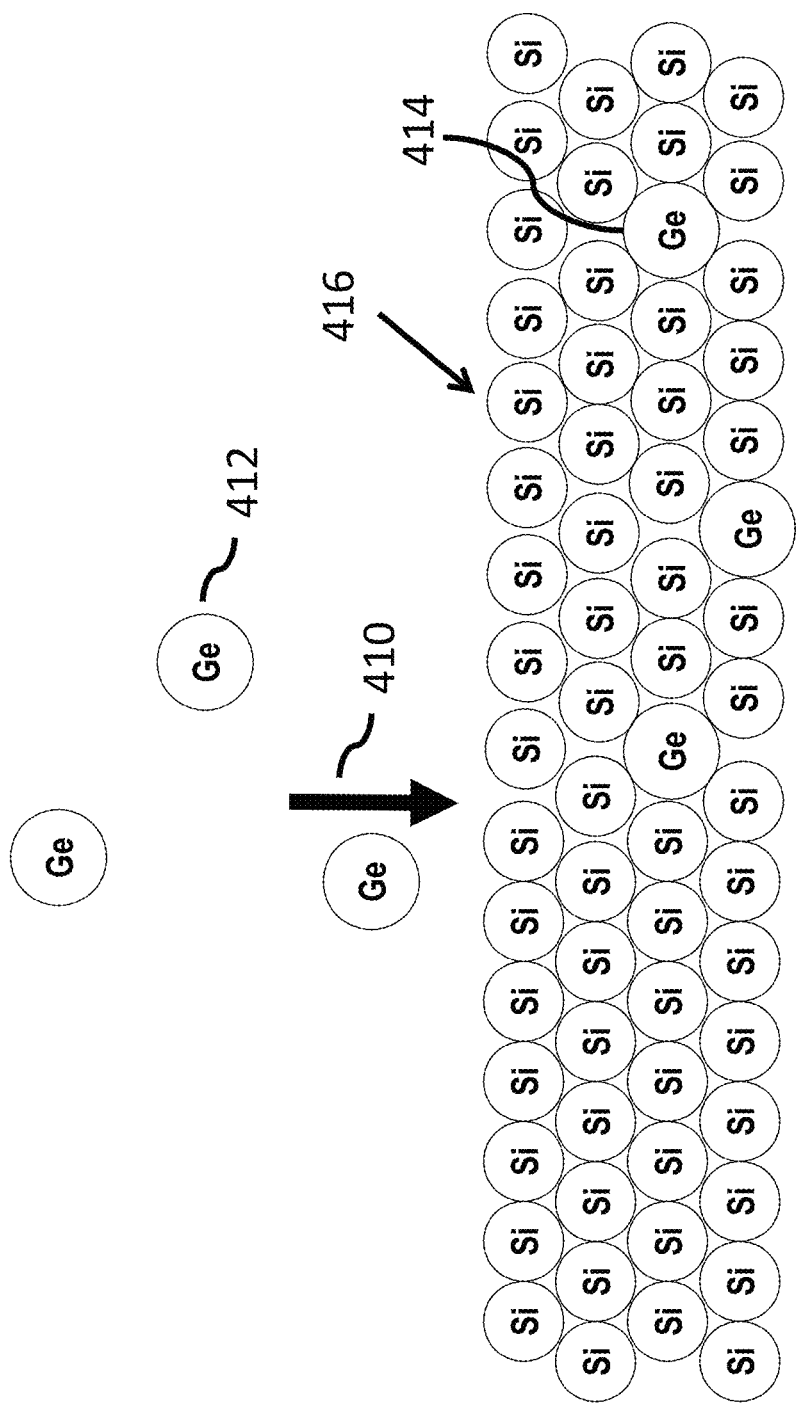
FIG. 4B shows an example of a direct material modification process using direct implantation.

FIG. 4B shows an example of a direct material modification process using direct implantation. In direct implantation embodiments as shown in FIG. 4B, ion beams 410 can themselves comprise the dopant source, the dopant being implanted through energetic impact. Direct implantation can be used, for example, for highly-localized implantation of transistor channels, with dopant profile (e.g., depth, geometry, dose, and location) specified directly by a design layout database. For example, Ge atoms 412 (comprising ion beam 410) can be implanted 414 in Si channels 416 to induce stress to increase carrier mobility and device speed.

Figure 8:
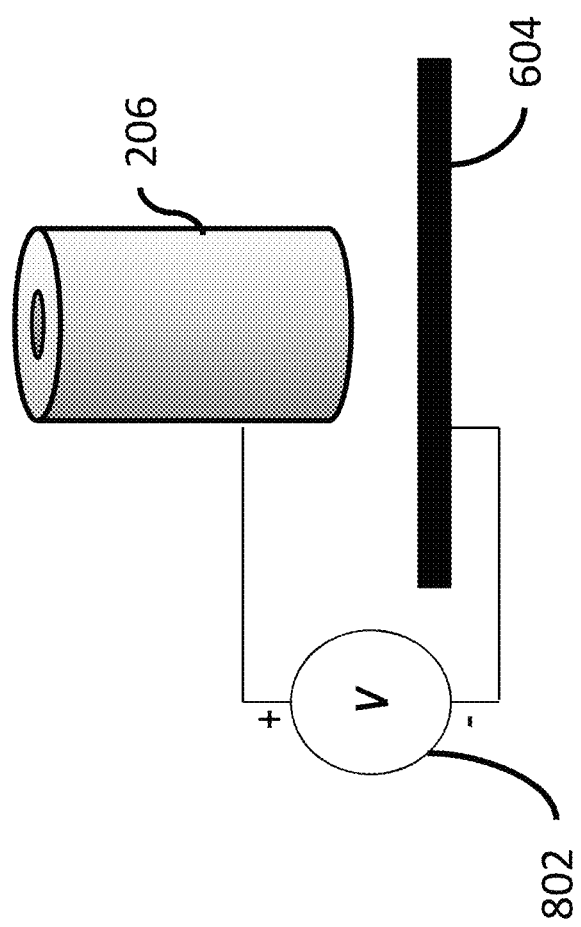
FIG. 8 schematically shows an example of a voltage bias applied between a charged particle beam column and a substrate.

Using an array of charged particle beams targeted in direct dependence on a design layout database, ions can be implanted using knock-on implantation or direct implantation LOCALLY, to selected depths, in selected geometries, with selected dopant doses, in targeted locations, to rapidly pattern a substrate with doped structures, such as transistors, a hard mask (etch-resistant) or etch-sensitive region, or other structure at depths accessible at available beam energies (which can be increased by substrate biasing, see FIG. 8). Local implantation allows for controlled variation of ion implantation dose.

In some embodiments, temperature (and thus, indirectly, diffusion rates) can be monitored using local photon detectors.

Figure 5A:
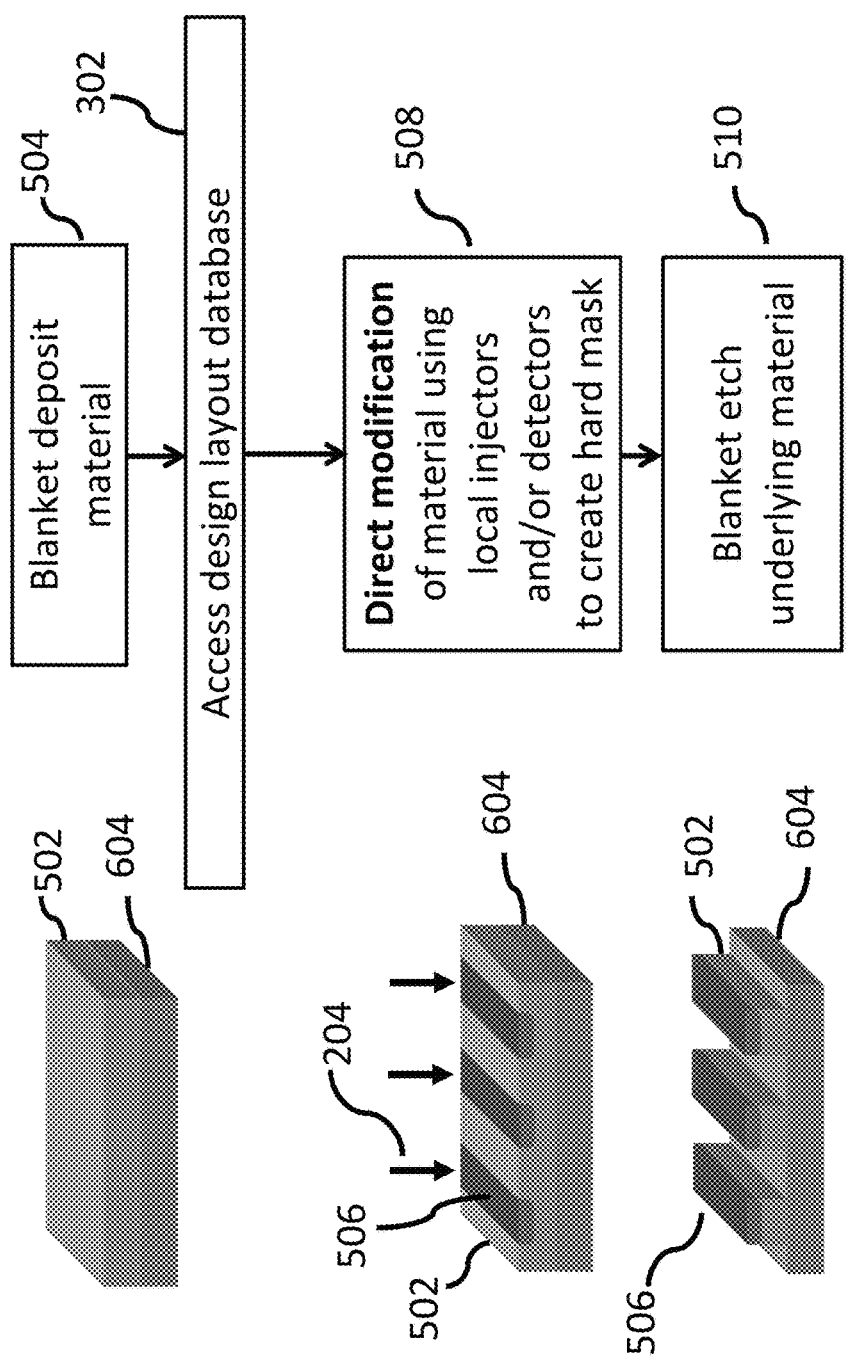
FIG. 5A shows an example of a direct material modification process used to etch pattern on a substrate.
Figure 5B:
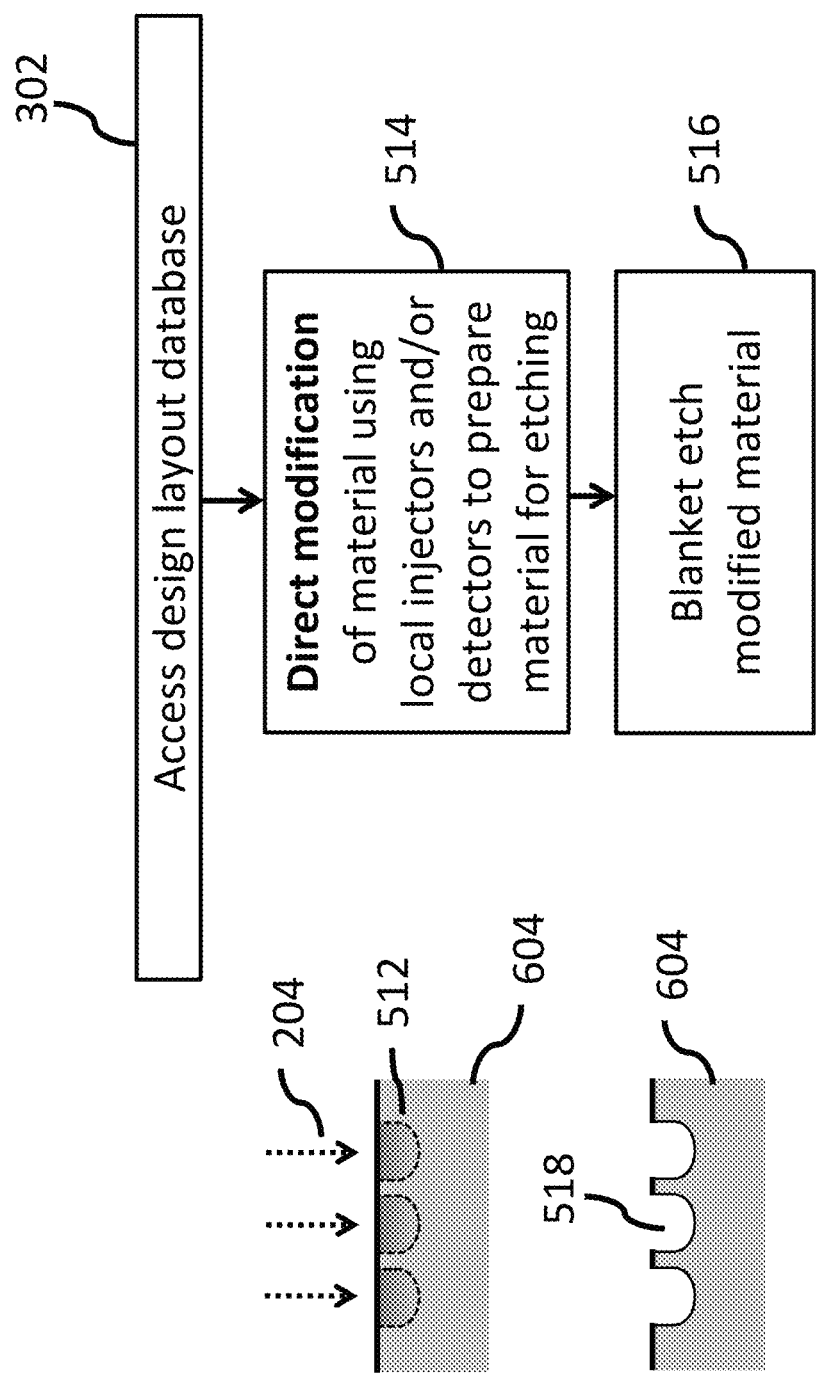
FIG. 5B shows an example of a direct material modification process used to etch pattern in a substrate.

FIGS. 5A and 5B show examples of direct material modification processes used to etch pattern in a material WITHOUT A RESIST LAYER. A design layout database is used to directly target where and how material will be modified on or in a substrate. Material modification, using local gas and/or photon injectors and/or detectors, can be used to directly modify etch selectivity of material on or in a substrate 320.

FIG. 5A shows an example of a direct material modification process used to etch pattern in a material on a substrate WITHOUT A RESIST LAYER. A target material 502 is blanket-deposited on the substrate 604 in step 504 (or an etch target material may already be present on the substrate 604, e.g., a device to be removed or repaired, or the substrate 604 itself can be used as the target material 502). The design layout database is then accessed 302, and ion implantation (preferably direct, though in some embodiments knock-on implantation can also be used), targeted in direct dependence on the design layout database, is used to dope the target material to create a hard mask 506 in the design layout database-designated pattern 508. An etch tool is then used to blanket etch the substrate 510, etching only the unmodified target material 502, to express in the target material 502 the negative of the pattern expressed in the hard mask 506.

FIG. 5B shows an example of a direct material modification process used to etch pattern in a substrate WITHOUT A RESIST LAYER. The design layout database is accessed 302, and ion implantation (preferably direct, though in some embodiments knock-on implantation can also be used), targeted in direct dependence on the design layout database, is used to dope the target material (as shown in FIG. 5B, the substrate 604) to create etch-sensitive regions 512 in the design layout database-designated pattern 514. An etch tool is then used to blanket etch the substrate 516 to express the pattern 518.

Figure 6A:
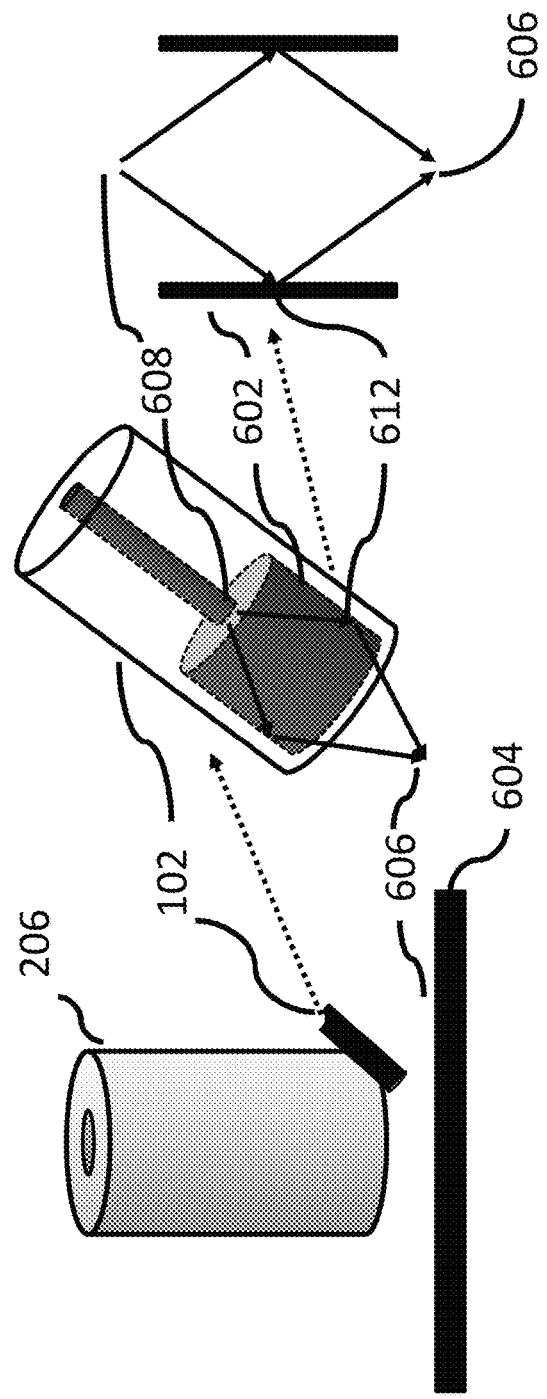
FIG. 6A schematically shows an example of a local gas injector mounted on a charged particle beam column.

FIG. 6A schematically shows an example of a local gas injector 102 mounted on a charged particle beam column 206. The gas injector preferably 102 includes a kinetic lens 602, comprising a smooth rigid body (preferably made of metal), to increase the partial pressure of gas at the focal point of the kinetic lens 602 on the substrate 604 surface 606 by focusing or collimating the gas particle flow from the gas injector outflow opening 608. Various designs of kinetic lens 602 are possible; the example shown in FIG. 6A is a cylindrical kinetic lens 602.

The gas injector 102 is connected to one or more gas sources, comprising the gas(ses) to be injected by the gas injector 102 to create or assist in creating a desired chemical environment at the main-field deflection area 610 on the surface of the substrate 606. Multiple gas injectors 102, injecting the same or different gasses, can be used.

Preferably, one or more local gas injectors 102 are configured to inject a reactive gas (appropriate to the particular direct material modification process) per column 206 performing direct material modification. Local gas injectors 102 are preferably mounted on or near the bottom of corresponding columns 206, as close to corresponding main-field deflection areas 610 as possible. (A main-field deflection area 610 is generally in a fixed position relative to the corresponding column 206, and moves across the substrate's surface 606 as the stage moves).

Gas flow from a local gas injector 102 is preferably limited to the molecular flow regime (not viscous flow) to enable proper function of a kinetic lens 602 connected to the gas injector outflow opening 608. (If the gas flow is in a viscous flow regime, the kinetic lens 602 will generally not function as a lens.) In the molecular flow regime ("molecular flow"), the mean free path for gas particles (atoms or molecules of the gas) is large compared to a characteristic dimension of the local gas injector 102 or detector 106 (e.g., the path taken by gas particles between the substrate surface 606 and the gas outflow or inflow opening 608, 614). This makes it much more likely that gas particles will collide 612 with the side of the lens 602, or (for a gas injector 102) the substrate surface 606, or (for a gas detector 106) enter the gas inflow opening 614, before hitting another gas particle.

A "kinetic lens" 602 is an arrangement of one or more smooth and rigid, flat and/or curved surfaces configured to reflect gas particles, fixed in position with respect to a corresponding gas injector outflow opening 608 or gas detector inflow opening 614; such that (for a gas injector) gas particles originating at a gas injector outflow opening which intersect 612 with the kinetic lens 602 are collimated or redirected (e.g., focused) towards the corresponding main-field deflection area 610; and such that (for a gas detector 106) gas particles originating at the beam impact location (or the main-field deflection area 610) which intersect 612 with the kinetic lens 602 are redirected (e.g., focused) towards the gas detector inflow opening 614. (Generally, surfaces of a kinetic lens 602 can be thought of as similar to optical mirrors, but for gas particles.) Various designs of kinetic lens 602 can be used (see, for example, FIGS. 6A, 6B, 6C, 6D and 6E).

Preferably, kinetic lens 602 surfaces are arranged so that they do not prevent particles (atoms or molecules) of outflow gas within the kinetic lens 602 from reaching the substrate surface 606; and do not prevent particles of inflow gas within the kinetic lens 602, originating from the main-field deflection area 610 of the corresponding column 206, from reaching the inflow opening 614.

A kinetic lens 602 can be used to improve localization to the main-field deflection area 610 of increased partial pressure of an injected gas. A kinetic lens 602 can also be used to increase specificity and collection rate for a gas detector 106. "Specificity", as used herein, refers to the selectiveness of a gas detector 106 corresponding to a column 206 for material that originated within a corresponding frame 610 and not from, e.g., the frame 610 of another column 206.

Figure 6B:
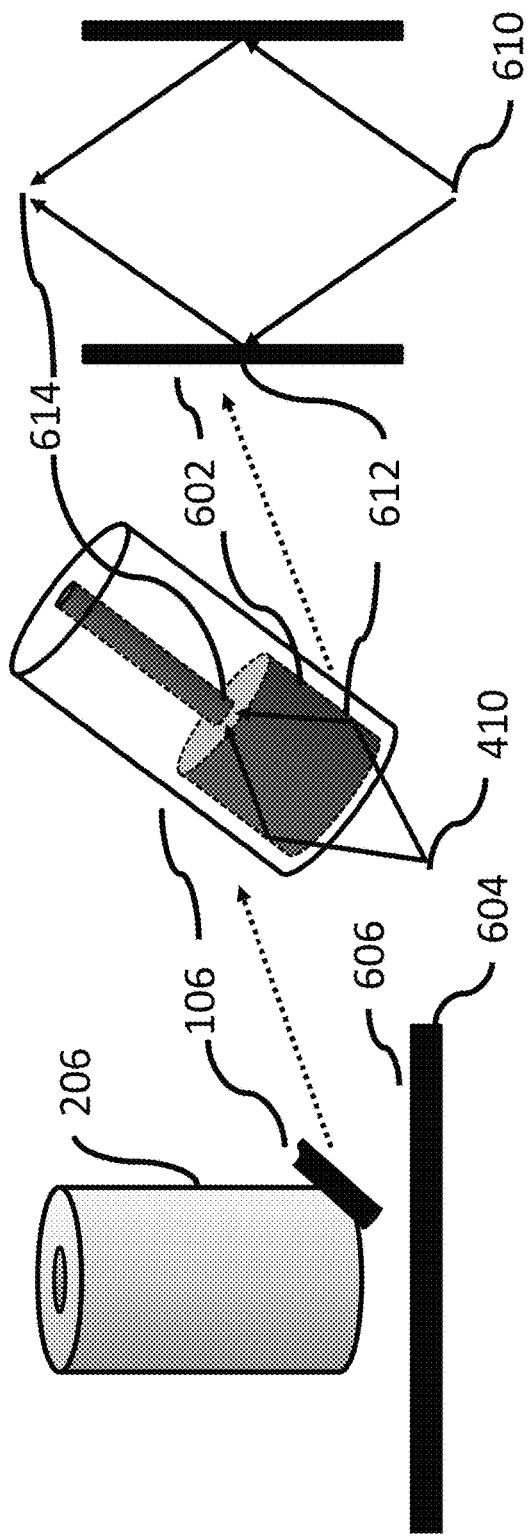
FIG. 6B schematically shows an example of a local gas detector mounted on a charged particle beam column.

FIG. 6B schematically shows an example of a local gas detector 106 mounted on a charged particle beam column 206. Preferably, a local gas detector 106 comprises a gas inflow opening 614 connected to a kinetic lens 602 configured to redirect gas particles intersecting 712 the kinetic lens 602 into the gas inflow opening 614. The gas inflow opening 614 is connected to a secondary ion mass spectrometer configured to analyze incoming gas particles and perform process monitoring (e.g., detecting ablated material or monitoring partial pressure of injected gas) and provide control feedback using said analysis.

Figure 6D:
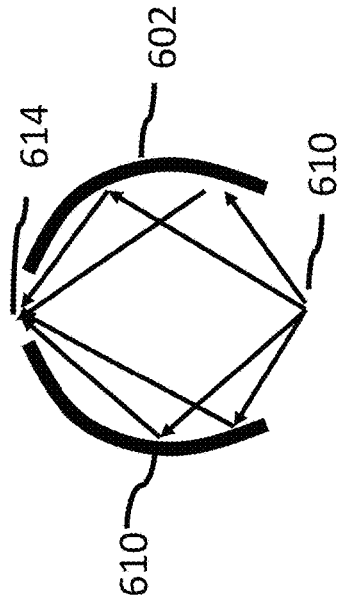
FIG. 6D schematically shows an example of a gas injector with a rotational ellipsoid kinetic lens.
Figure 6C:
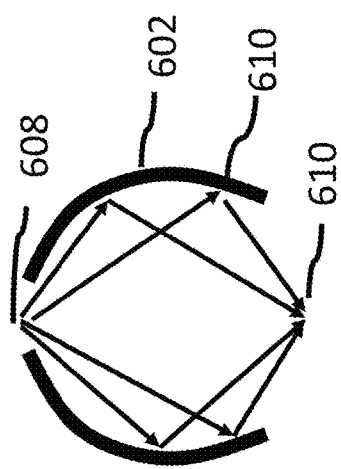
FIG. 6C schematically shows an example of a gas injector with a rotational ellipsoid kinetic lens.

FIG. 6C schematically shows an example of a gas injector 102 with a rotational ellipsoid kinetic lens 602.

FIG. 6D schematically shows an example of a gas detector 106 with a rotational ellipsoid kinetic lens 602.

A kinetic lens 602 is preferably shaped as a (truncated) rotational ellipsoid (an ellipsoidal reflector, with two equal minor axes and a longer major axis). Advantageously, gas particles which originate at one major axis focus and which intersect the kinetic lens 602 surface are reflected towards and converge at the other major axis focus. Preferably, one major axis focus of the rotational ellipsoid is located at the main-field deflection area 610 on the substrate surface, and the other major axis focus is located at the gas outflow or inflow opening 608, 614 (which can be modeled as a point source or point sink, respectively, for this purpose).

Preferred embodiments using gas injectors 102 use rotational ellipsoid kinetic lenses 602 configured such that gas particles originating at the gas injector outflow opening 608 that intersect 612 the kinetic lens surface 602 are reflected towards the main-field deflection area 610, increasing partial pressure of the gas in the frame 610.

Preferred embodiments using gas detectors 106 use rotational ellipsoid kinetic lenses 602 configured such that gas particles originating in the main-field deflection area 610 are reflected towards the gas detector inflow opening 614, significantly improving gas detector 106 collection efficiency and specificity (thus improving, e.g., sensitivity and signal to noise ratio of gas spectrometer measurement and analysis).

Figure 6E:
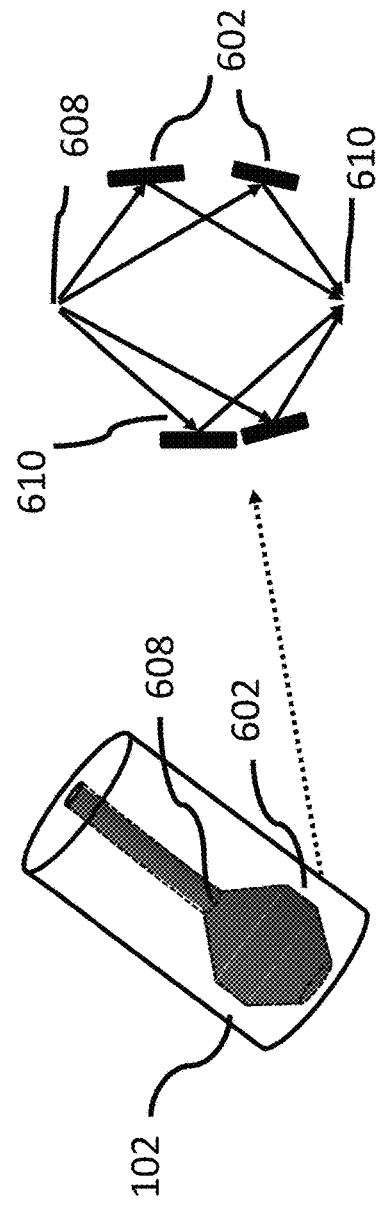
FIG. 6E schematically shows an example of a gas injector with a kinetic lens.

FIG. 6E shows an example of a gas injector 102 or gas detector 106 with a kinetic lens 602. Approximations of a rotational ellipsoid can be made using flat and/or curved surfaces configured to reflect (at least some trajectories of) gas particles originating at one (approximate) focus towards the other (approximate) focus.

FIG. 7 schematically shows an example of a photon injector 104 and a photon detector 108 mounted on a charged particle beam column 206. Preferably, a photon injector 104 comprises a light source optically connected by an optical fiber to a (cylindrical) rod lens focused on the main-field deflection area 610; and a photon detector 108 comprises a light sensor optically connected by an optical fiber to a rod lens focused on the main-field deflection area 610.

Photon injectors 104 and photon detectors 108 can be used as discussed above. Further, as shown in FIG. 7, a photon injector 104 and photon detector 108 pair can be arranged so that photons emitted by a photon injector 104 are reflected off the substrate 604 and collected by the paired photon detector 108. The photon injector 104 used for this purpose can be used specifically to provide photons for the photon detector 108 to perform, e.g., polarimetry, reflectometry, interferometry or optical emission spectroscopy. Alternatively, the photon injector 104 may be dual-purpose, e.g., the detected photons may be IR photons emitted by the photon injector 104 for temperature control, or photons emitted to excite substrate surface material electrons or adsorbed material electrons to facilitate a desired substrate surface chemistry, or to perform highly localized photon-induced dissociation.

Injected photons can also be pulsed, e.g., to enable local temperature measurement, or optical emission spectroscopy of photons emitted by substrate surface material, in between pulses.

A cooled substrate 1004 (e.g., indirectly cooled by the chuck) can also be used to assist in increasing the adsorption rate of reactant and other process-critical gases on the substrate 604, and/or to keep the average temperature of the substrate approximately constant at a designated temperature (and that temperature can be modified locally by photon injectors 104). The average temperature of the substrate 604 can be monitored and controlled by a substrate temperature control 702.

FIG. 8 schematically shows an example of a voltage bias 802 applied between a charged particle beam column 206 and a substrate 604 to create highly localized control of charged particle impact over a wide range of energies.

Substrate electrical bias 802 can be used, along with control of beam energy at each column 206, to optimize the efficiency of charged-particle induced chemistry and/or physical effects. Preferably, beam energy is constant (or changes slowly and/or rarely). As the desired substrate surface chemistry changes (which can include, for example, a gas injector output changing), the electrical bias 802 of the substrate can be changed so that the total landing energy of an individual charged particle beam 204 (including energy contributed by the substrate electrical bias 802) is (or is significantly closer to) the landing energy that will optimize the rate and/or efficiency of the desired reaction(s), e.g., dissociation of adsorbed reactive (modification process) gas(ses).

Figure 9A:
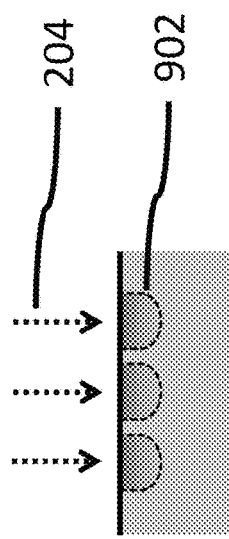
FIG. 9A schematically shows an example of the results of uniform-profile material modification.

FIG. 9A schematically shows an example of the results of uniform-profile direct material modification (e.g., ion implantation), including uniform-depth doping profiles 902.

Figure 9B:
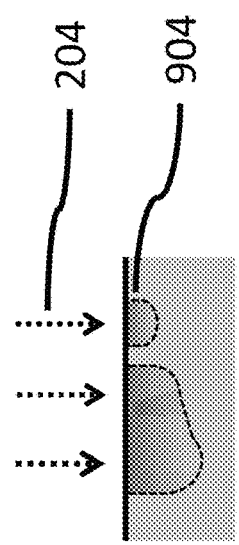
FIG. 9B schematically shows an example of the results of differentiated-profile material modification.

FIG. 9B schematically shows an example of the results of differentiated material modification profiles, including differentiated-depth features or differentiated concentrations of dopants 904. Columns 206 can be configured independently to process material simultaneously but differently; e.g., to write different patterns to different depths and/or concentrations at different rates using different beam and injection parameters. Since columns 206 are controlled independently, they can be used to create local variations in material modification profiles. Differentiated-profile direct material modification can be achieved by varying, for example, charged particle beam landing energy, exposure time, dose, local reactant partial pressure, or local reactant chemistry beneath a charged particle beam column 206 as the targeted beam position is moved.

Figure 10:
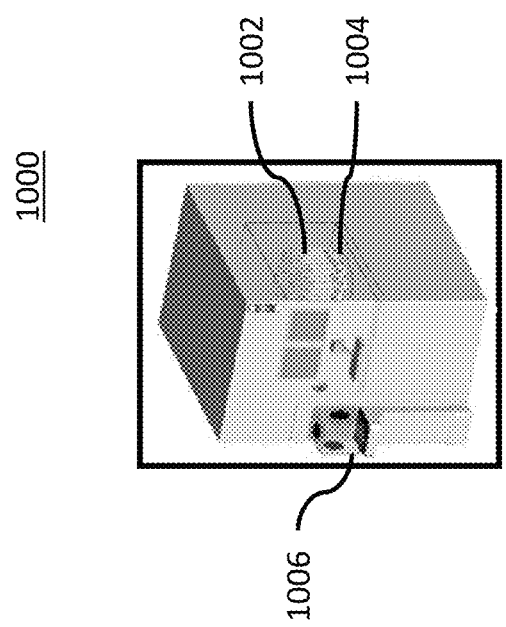
FIG. 10 schematically shows an example of a multiple column charged particle beam system FIG. 11 schematically shows an example of a charged particle beam cluster tool.

FIG. 10 schematically shows an example of a multiple column charged particle beam system 1000. An appropriately configured multi-column charged particle beam system 1000 can be used for highly localized material modification using, for example, ion implantation, charged particle-induced cross-linking or dissociation of polymers, or ion impact-induced ablation. The system shown in FIG. 8 includes an array 1002 of miniature charged particle beam columns 206, a substrate stage with chuck 1004, a wafer loading and unloading mechanism 1006, control electronics, a vacuum system, an alignment system, vibration isolation and magnetic shielding. Depending on (for example) the particular direct material modification application intended, a multi-column charged particle beam system 1000 preferably also includes one or more of local gas injectors 102, local photon injectors 104, local gas detectors 106 and local photon detectors 108.

Figure 11:
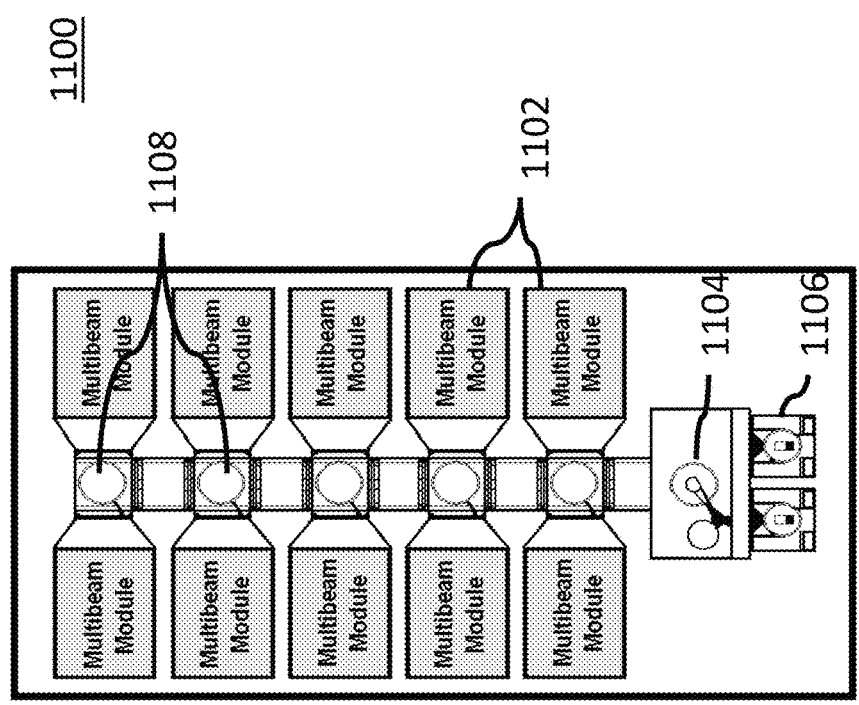

FIG. 11 schematically shows an example of a charged particle beam cluster tool 1100. A charged particle beam cluster tool 1100 comprises multiple charged particle beam modules 1102. An individual charged particle beam module 1102 comprises an array 1002 of charged particle beam columns 206 in ultra high vacuum, as well as a wafer stage 1004 and alignment mechanism. Individual modules 1102, and/or individual columns 206 within a module 1102, can be configured to specialize in a particular type of charged particle beam substrate processing. For example, one module 1102 can be configured for direct material modification using ion implantation, while a second module 1102 is configured for direct material modification using electron beam-induced polymer dissociation. In another example, some columns 206 in a module 1102 can be configured to perform electron beam-assisted direct material modification while other columns 206 in that module 1102 are configured and optimized for substrate inspection using electron beam imaging.

In addition to process modules 1102, a cluster tool 1100 generally also comprises a substrate handling system 1104, a substrate loading/unloading system 1106 and a factory interface. Within a cluster tool 1100, a wafer transport system 1108 delivers wafers to one or more—in some embodiments, all (e.g., sequentially)—of the tool's process modules 1102, and can also perform in-vacuum pre-alignment. Other sub-systems necessary for charged particle beam control, gas injection, and substrate processing are not depicted (e.g. control electronics, vacuum systems, alignment systems, vibration isolation, magnetic shielding and gas injection flow control and measurement).

Figure 12:
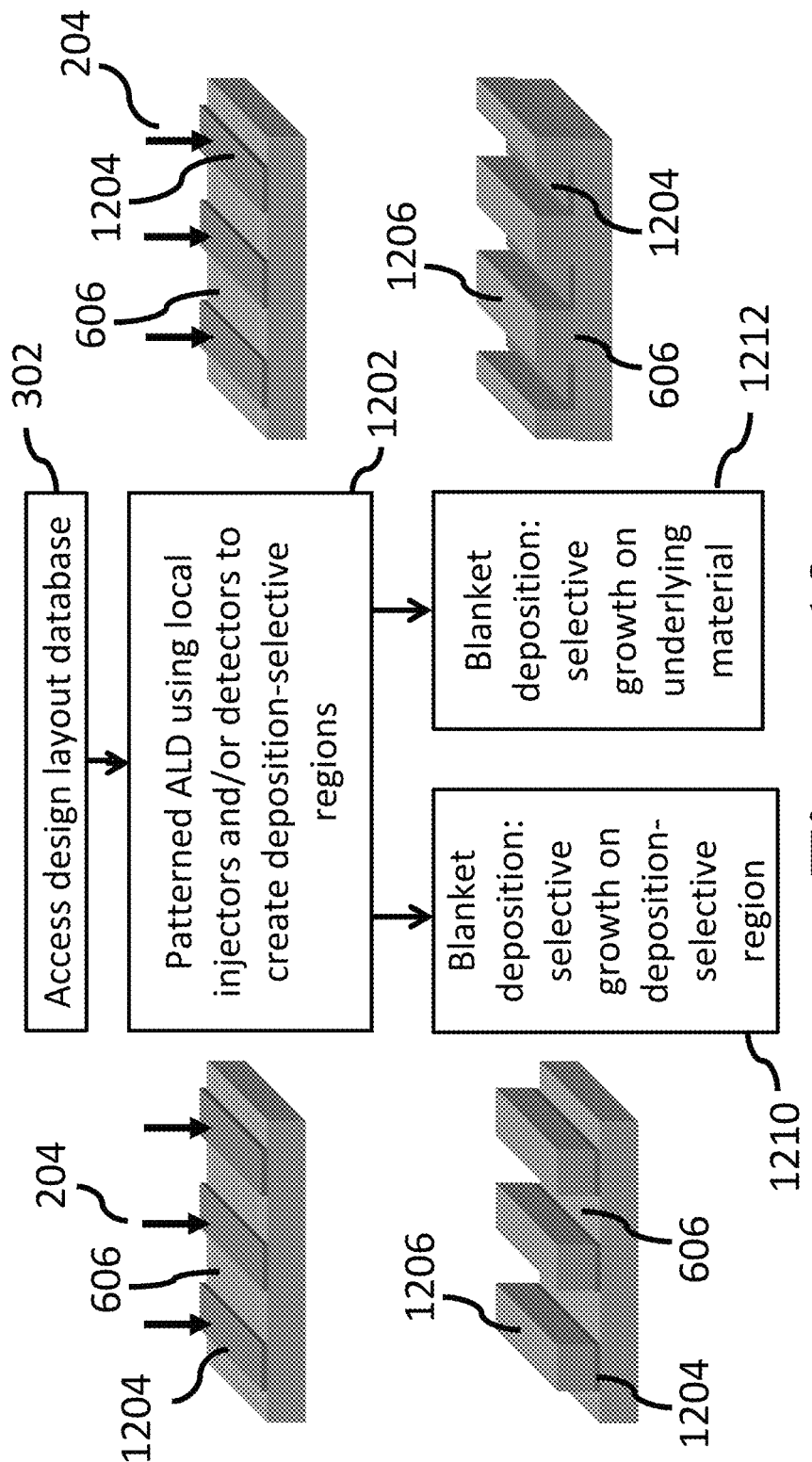
FIG. 12 shows an example of a direct material modification process used to deposit patterned material on a substrate FIG. 13 schematically shows an example of a charged particle beam column.

FIG. 12 shows an example of a direct material modification process used to deposit patterned material on a substrate WITHOUT A RESIST LAYER.

"Atomic layer deposition" ("ALD") is a technique for depositing atomically-thin (typically a few atoms, e.g., 2 or 3 atoms, thick) layers of material using reactive gasses (typically two different reactants A and B that react in an ABAB binary reaction sequence) as deposition precursors and sequential reaction steps that are self-limiting (i.e., the details of the process limit deposition to a single layer of adsorbed reactive gas particles at a time).

Patterned ALD can be performed as disclosed in U.S. patent application Ser. No. 14/966,165, using local injectors 102 to inject deposition precursors. For example, a first species is injected and reacts with a surface layer of a material to form a half-reaction-cycle layer by adsorption of the first species (reaction A). A second species is then injected and reacts with the first species to form a desired deposition layer (reaction B). Columns 206 comprising a charged particle beam column array 1002 can be individually controlled to provide ion or electron beam 204 energy for reaction B only in locations designated by the design layout database, thus adding one or more highly conformal layers deposited only in the targeted locations. Reaction A steps and performed, then reaction B steps are performed (i.e., without overlap), to avoid (or minimize) random deposition.

As shown in FIG. 12, a design layout database is used to designate 302 where and how material will be deposited on a substrate surface 606. Patterned ALD can then be performed (preferably, in direct dependence on the design layout database) using charged particle beams 204 and corresponding local gas injectors 102 (and in some embodiments other local photon injectors 104 and/or local gas detectors 106 or photon detectors 108) in step 1202 to deposit a patterned layer 1204.

The first and second species, and a process material 1206 intended to be deposited in a pattern designated by the design layout database, can be selected such that the patterned ALD-deposited layer(s) 1204 comprises one or more deposition-selective regions on the substrate surface 606. "Deposition-selective" is defined to mean that the process material 1206 either (1) will be deposited in locations where a deposition-selective layer 1204 has been formed but not on underlying material 1208; or (2) will not be deposited in locations where a deposition-selective layer 1204 has been formed but will be deposited on underlying material 1208.

Following deposition by ALD 1202 of one or more deposition-selective layers 1204, the process material 1206 can be blanket-deposited, resulting either in selective growth on the deposition-selective region 1204 and not the underlying material 1208 in step 1210; or in selective growth on the underlying material 1208 and not the deposition-selective region 1204 in step 1212. This expresses (in a positive or negative sense) in the process material 1206 the pattern expressed in the ALD-deposited layer(s) 1204. Patterned ALD's advantages in yield rate and cycle time can thus be conferred on bulk material deposition.

Figure 13:
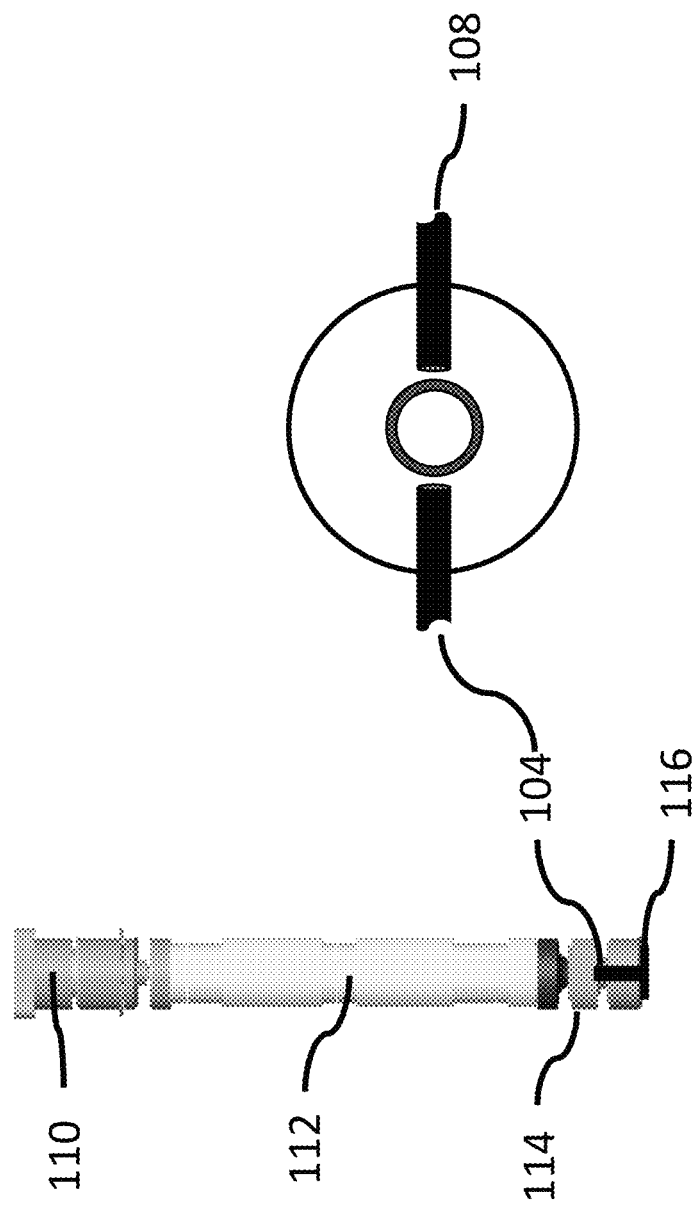

FIG. 13 schematically shows an example of a charged particle beam column 206 configured for non-reactive direct material modification, comprising: a charged particle beam gun 110 (an ion gun or electron beam gun, respectively), including a charged particle source (an ion or electron source, respectively), aperture and electrostatic lens; a deflection assembly 112 for blanking the charged particle beam 204, deflecting the charged particle beam trajectory, and/or modifying the charged particle beam shape (blanking, deflecting or reshaping the ion or electron beam 204, respectively); a main lens 114, for focusing the charged particle beam 204 (ion or electron beam) or adjusting the beam size at the substrate plane; one or more local photon injectors 104; one or more local photon detectors 108; and an electron detector 116.

As will be understood by one of ordinary skill in the arts of charged particle beam material modification, focus areas (as described in this application) of gas and photon injectors and detectors 102, 104, 106, 108 (typically, the main-field deflection area 710) are approximate; that is, they comprise the described area, within (plus or minus) the range or error allowed by the particular process (and/or application) performed by the corresponding column 206, such that the desired function, effect and/or accuracy of that process (and/or application) are preserved.

Figure 14:
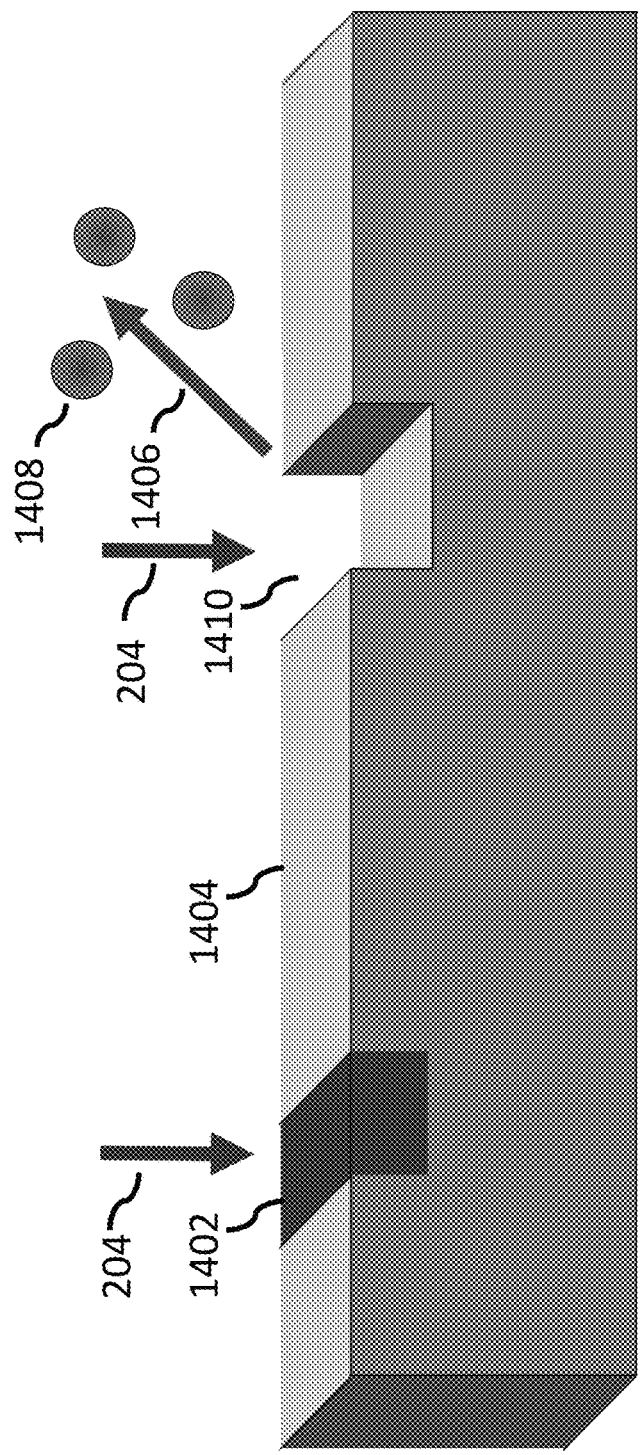
FIG. 14 shows an example of a process for dual tone charged particle beam lithography.

FIG. 14 shows an example of a process for dual tone charged particle beam lithography. A charged particle beam 204 will cause exposed portions 1402 of a dual tone resist 1404 to become soluble or insoluble in corresponding developer(s) depending on the energy level of the beam 204; generally, two different developers to address both "tones" for a dual tone resist 1404 that can be exposed to perform dual tone patterning without immediate dissociative ablation 1406. Some resists (e.g. any positive resist) exhibit dissociative ablation 1406 at high impact energy (negative tone) and polymer cross-linking at low impact energy (positive tone), allowing dual tone patterning to be performed for resists that do not allow dual tone patterning without immediate dissociative ablation 1406. Ablated material 1408 can be detected by local gas detectors 104. Ablated portions 1410 of the resist can be detected using, e.g., local photon detectors 108.

By using multiple charged particle beams targeted in direct dependence on a design layout database, highly-localized, simultaneous positive and negative tone patterning of resist can be performed. This is enabled by the ability to individually control beam landing energies for various (or each of the) columns.

According to some but not necessarily all embodiments, there is provided: A method for targeted knock-on implantation using multiple charged particle beam columns, individual columns projecting individual charged particle beams at the substrate, comprising the actions of: a) injecting at least one gas, using local gas injectors, onto multiple different frames corresponding to multiple different ones of the beams, said gas selected such that a dopant species component of said gas will be adsorbed on the substrate surface; and b) scanning said frames using said corresponding beams, locations targeted by said beams in dependence on the design layout database, wherein a beam energy of said corresponding beams is selected to implant particles of said adsorbed gas impacted by particles of said beams to a selected substrate surface depth range.

According to some but not necessarily all embodiments, there is provided: A method for targeted ion implantation using multiple ion beam columns, individual columns projecting individual ion beams at the substrate, comprising the actions of: targeting locations on the substrate surface with the beams in direct dependence on the design layout database, a beam energy of the beams selected to implant ions comprising the beams to a selected depth range in the substrate surface, ones of the ion beams comprising a selected dopant species; wherein said targeting is performed differently and simultaneously by different ones of said columns.

According to some but not necessarily all embodiments, there is provided: A method for charged particle beam lithography using multiple charged particle beam columns, individual columns projecting individual charged particle beams at the substrate, comprising the actions of: writing multiple features on a dual-tone resist on the substrate using the beams, at least one of the beams using a beam energy selected to write said features by cross-linking bonds in said resist, and at least one of the beams using a beam energy selected to write said features by dissociating bonds in said resist; wherein said cross-linking modifies a solubility of said resist in a developer, and said dissociating modifies said solubility and/or ablates said resist; and wherein the beams perform said cross-linking and said dissociating differently and simultaneously.

According to some but not necessarily all embodiments, there is provided: A charged particle beam patterning tool, comprising: multiple charged particle beam columns, individual ones of said columns configured to produce an individual charged particle beam, different ones of said columns having different writing areas, at least one of said columns configured to produce a beam with a beam energy selected to cross-link bonds in a dual-tone resist, and at least one of the columns configured to produce a beam with a beam energy selected to dissociate bonds in said resist; and one or more column controllers storing instructions in a computer-readable nontransitory medium that, when executed, direct said controllers to control said cross-linking columns and said dissociating columns to differently and simultaneously write multiple features on the substrate.

According to some but not necessarily all embodiments, there is provided: A method for charged particle beam patterning using multiple charged particle beam columns, individual columns projecting individual charged particle beams at the substrate, comprising the actions of: a) serially injecting, using multiple local gas injectors, an initial gas and then another gas onto multiple frames corresponding to multiple different ones of the beams, said initial gas selected to be adsorbed by the substrate, said another gas selected to react with said initial adsorbed gas to form a deposited layer; b) scanning the frames using said corresponding beams, locations being targeted by said corresponding beams in dependence on the design layout database, wherein a beam energy of said beams is selected to provide the energy for said adsorption and/or said reaction; and c) blanket depositing a material on the substrate surface; wherein said initial gas, said another gas and said material are selected such that said deposited layer is deposition-selective with respect to said material.

According to some but not necessarily all embodiments, there is provided: A charged particle beam patterning system, comprising: multiple local gas injectors configured to inject an initial gas or another gas onto corresponding frames, said initial gas selected to be adsorbed by the substrate, said another gas selected to react with said initial adsorbed gas to form a deposited layer; multiple charged particle beam columns, individual ones of said columns configured to produce an individual charged particle beam, different ones of said columns having different writing areas, a beam energy of said beams selected to provide the energy for said adsorption and/or said reaction; one or more column controllers storing instructions in a computer-readable non-transitory medium that, when executed, direct said controllers to: control said local gas injectors to serially inject said initial gas and said another gas into corresponding frames; and control said columns to scan said frames using said beams, targeting substrate locations in dependence on the design layout database; and a blanket deposition tool configured to blanket deposit a material, wherein said initial gas, said another gas and said material are selected such that said deposited layer is deposition-selective with respect to said material.

According to some but not necessarily all embodiments, there is provided: Methods, devices and systems for targeted, maskless modification of material on or in a substrate using charged particle beams. Electrostatically-deflected charged particle beam columns can be targeted in direct dependence on the design layout database to perform direct and knock-on ion implantation, producing patterned material modifications with selected chemical and 3D-structural profiles. The number of required process steps is reduced, reducing manufacturing cycle time and increasing yield by lowering the probability of defect introduction. Local gas and photon injectors and detectors are local to corresponding individual columns, and support superior, highly-configurable process execution and control. Targeted implantation can be used to prepare the substrate for patterned blanket etch; patterned ALD can be used to prepare the substrate for patterned blanket deposition; neither process requiring photomasks or resist. Arrays of highly configurable beam columns can also be used to perform both positive and negative tone lithography in a single pass.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some embodiments, multibeam tools comprising electrostatically-deflected charged particle beam columns using local gas and/or photon injectors and/or detectors can also be used to perform other substrate manufacturing processes, particularly: addition of materials to a substrate surface as designated by a design layout database and localized to substrate positions directly affected by said beams (material addition); and removal of substrate materials from the substrate surface as designated by a design layout database and localized to substrate positions directly affected by said beams (material subtraction).

In some embodiments, (preferably minimal) overlap of writing areas can be allowed to ensure complete access to useful substrate surface by charged particle beams.

Though particular types of direct material modification processes have been described hereinabove, other charged particle beam-assisted or -induced direct material modification processes can also be used.

In some embodiments, direct material modification can be used to modify material bulk and/or surface properties. In some embodiments, direct material modification can be used to modify a dopant profile of a substrate.

In some embodiments, material electrical properties can be modified by ion implantation of semiconductor wafers to form p- and n-doped active areas or to adjust material resistance or capacitance; polymers such as photoresist can be modified by electron-beam induced cross-linking or dissociation; and insulating layers can be modified by ion implantation for the purpose of altering tensile and compressive stress.

In some embodiments, material crystallinity and grain structure can be modified by doping to adjust mechanical, thermal, optical, and electrical properties. See, e.g., the Roschchupkina and Jain references cited more fully below.

In some embodiments, material etch selectivity, or solubility/insolubility, can be modified by charged particle beam induced cross-linking or dissociation, or by defect introduction to prepare the material for selective etch.

In some embodiments, material hydrophilicity/hydrophobicity can be modified by doping. See, e.g., the Yamada reference cited more fully below.

Though certain embodiments have been disclosed herein using particular types of adsorption, one of ordinary skill in the arts of charged particle beam material modification will understand that in some embodiments, other types of adsorption can be used, e.g., dissociative adsorption, ligand exchange and associative chemisorption.

In some embodiments, post-exposure (irradiation) bake of dual-tone resist using local (IR) photon injectors can be used, e.g., to improve resist adhesion and reduce underetching in subsequent wet chemical etching. See, e.g., http://www.photoresists.eu/photoresist_1522.html (accessed Dec. 14, 2015), which is incorporated herein by reference.

In some embodiments corresponding to FIG. 12, blanket-deposition can be performed in the same vacuum chamber as ALD. In some embodiments corresponding to FIG. 12, blanket-deposition can be performed in a different vacuum chamber from ALD.

In some embodiments, local (IR) photon injectors can be used to accelerate purging of excess reactants from the substrate surface.

In some embodiments, a cooled substrate stage can be used to assist in minimizing dopant migration following implantation.

In some embodiments, ion beam columns can be matched to electron beam columns by calibrating deflection parameters (and/or other column parameters) to take into account beam composition (and other column configuration) differences.

In some embodiments, ion beam columns are matched to ion beam columns, and electron beam columns are matched to electron beam columns, but ion beam columns are not matched to electron beam columns.

In some embodiments, patterns can be designed to increase the average number of features per frame that contains features, and/or to increase the number of frames that contain no features; e.g., to take advantage of per-frame localization of endpoint detection and process monitoring, and/or to improve signal-to-noise ratio of process measurements and analysis.

In some embodiments, a column (i.e., with particular injectors and/or detectors) can be used to perform more than one material modification process type or other substrate process (e.g., imaging for purposes of defect detection) without changing the column's physical configuration.

In some embodiments, a physical configuration of a column can be specialized and/or optimized to perform a single material modification process type or other substrate process (e.g., imaging for purposes of defect detection).

In some embodiments, the body of an injector or detector interpenetrates the housing of a column (without interfering with charged particle beam path-related structures, or the beam itself).

In some embodiments, in which there is a mechanical impediment preventing making an injector or detector local, the injector or detector is located outside the perimeter of the corresponding column but within the writing area of the column.

In some embodiments, a local injector or detector is located between the column and the substrate surface.

In some embodiments (e.g., for some material modification processes and/or applications and/or other substrate manufacturing processes), there is a near-linear inverse proportionality between gas partial pressure increase within the main-field deflection area and direct material modification cycle time (e.g., when gas partial pressure is the rate-limiting parameter).

In some embodiments, one or more columns perform direct material modification corresponding to multiple layers of pattern in a single pass—e.g., within a single process cycle, on multiple layers in one or more frames (separate main-field deflection areas). In some such embodiments, different direct material modification process types are used to perform material modification on different ones of said multiple layers in a particular frame.

In some embodiments, local gas and/or photon detectors can be used to generate persistent per-column performance metrics.

In some embodiments, gas and/or photon injection can be performed prior to charged particle beam scanning, e.g., to prepare the substrate surface in advance.

Though particular combinations of local gas and photon injectors, and local gas, photon and electron detectors have been described herein, one of ordinary skill in the arts of material modification using charged particle beams will understand that various other combinations (in various physical arrangements), including some or all of said local injectors and detectors, with one or more of ones of said injectors and detectors local per column, can be used to configure a column and to perform direct material modification as disclosed herein.

In some embodiments, local detectors can be limited to local electron detectors used for critical dimension (CD) metrology or overlay (accurate placement of a pattern layer over one or more prior pattern layers), local photon detectors used for localized temperature monitoring, and local gas detectors used for localized process monitoring.

In some embodiments, local detectors can be limited to local electron detectors used for CD metrology or overlay, localized process monitoring and end point detection.

In some embodiments, local detectors can be limited to local photon detectors used for localized process monitoring and end point detection, e.g., in applications where overlay is not required.

In some embodiments, a local gas injector focuses gas particles on an area larger than the main-field deflection area; in some embodiments, a local gas injector does so for advance preparation of adjacent frames.

In some embodiments, a local gas detector can be used to perform analysis of gas particles with techniques other than secondary ion mass spectrometry.

In some embodiments, a kinetic lens is atomically smooth.

In some embodiments, the largest diameter of a kinetic lens is significantly larger than the diameter of the corresponding gas outflow or inflow opening.

In some embodiments, a kinetic lens is fixedly connected to a gas injector outflow or a gas detector inflow so that gas particles cannot escape from the connection between the kinetic lens and the corresponding gas outflow or inflow opening.

In some embodiments, a kinetic lens is wholly or partially nonmetallic.

In some embodiments, a kinetic lens is shaped such that few or no possible gas particle trajectories originating at an intended gas particle source (generally, the main-field deflection area or a corresponding gas injector opening) will result in a gas particle being "trapped" within the kinetic lens. In some embodiments, a kinetic lens is shaped such that few or no possible gas particle trajectories originating at an intended gas particle source will be reflected by the kinetic lens such that the gas particle moves closer to said source and further from the intended destination (generally, a corresponding gas detector opening or the main-field deflection area).

In some embodiments, a frame-facing kinetic lens opening is smaller than the largest diameter (orthogonal to the main axis) of the kinetic lens.

While particular examples of kinetic lens shapes have been described hereinabove, it will be apparent to one of ordinary skill in the arts of charged particle beam substrate material modification that other kinetic lens shapes can also be used to stochastically increase partial pressure in the main-field deflection area (e.g., through gas flow collimation and focusing). For example, ellipsoids with three different axes, paraboloidal reflectors, or elongated truncated tapering flat-sided or curved-sided horns.

In some embodiments, photon injectors and/or photon detectors can be fixed in position with respect to a corresponding individual column and disposed non-locally to that corresponding column, as long as they are able to focus sufficient emitted photons on, or collect sufficient emitted photons from, the main-field deflection area of said corresponding column (or larger area within the corresponding writing area) to effectively function in support of the particular material modification process(es) in which they are used.

In some embodiments, one or more lasers, e.g., diode lasers, provide the light source for a local photon injector.

In some embodiments, wavelength and/or wavelength range and/or distribution of photons emitted by a photon injector is tunable.

In some embodiments, non-local photon injectors are used, ones of said photon injectors fixed in position with respect to corresponding columns and having line of sight on a desired irradiation area within the corresponding writing area.

In some embodiments, non-local photon detectors are used, ones of said photon detectors fixed in position with respect to corresponding individual ones of the columns and having line of sight on a desired photon collection area within the corresponding writing area.

In some embodiments, a local photon injector focuses emitted photons on an area within the main-field deflection area.

In some embodiments, a local photon injector focuses emitted photons on an area larger than the main-field deflection area; in some embodiments, a local photon injector does so for advance preparation of adjacent frames.

In some embodiments, a local photon detector is arranged to collect reflected IR photons to perform process monitoring, where said IR photons were also used to increase the temperature of the substrate.

In some embodiments, other or additional analyses are performed on collected photons than those listed hereinabove.

In some embodiments, other or additional properties of substrate surface material are determined using analysis of detected photons than those listed hereinabove.

In some embodiments, photon injectors shine photons with one or more wavelengths between infrared and deep UV on the main-field deflection area.

In some embodiments, one or more local photon injectors are not paired with corresponding photon detectors, such that reflected light from the unpaired photon injectors will generally not be detected. In some embodiments, one or more local photon detectors are not paired with corresponding photon injectors, such that the unpaired photon detectors will primarily detect emitted (from the substrate surface), rather than reflected light.

A person of ordinary skill in the arts of charged particle beam substrate material modification will recognize that a variety of optical lens materials and shapes, and optical connections between light sources and optical lenses, can be used for photon injectors and detectors; and that a variety of light sources can be used for photon injectors.

In some photon injector embodiments, a light source and an optical lens are directly connected. In some photon detector embodiments, an optical lens and a sensor are directly connected. One of ordinary skill in the arts of charged particle beam material modification will understand that various types of connection between light source and optical lens, between sensor and optical lens, between gas injector outflow and gas source, and between gas detector inflow and mass spectrometer can be used.

In some embodiments, such as when a "shadowing" effect is anticipated such that one or more photon or gas injectors will not have line-of-sight on a target beam impact location during (at least one period of) a material modification process, two or more photon or gas injectors (respectively, spaced at, e.g., 90 or 180 degree increments) can be used so that when a photon or gas injector is "shadowed", one or more of the other photon or gas injectors will have line of sight on the target beam impact location.

In some embodiments, material modification as disclosed herein can be used in combination with other substrate processing procedures (e.g., optical lithography and/or charged particle beam lithography) that use resist and/or photomasks to produce semiconductor and other substrate devices.

In some embodiments, charged particle beam columns can use electrostatic focus mechanisms; in some embodiments, charged particle beam columns can use magnetic focus mechanisms.

Additional general background, which helps to show variations and implementations, may be found in the following publications, all of which are hereby incorporated by reference: Ivo Utke, et al., "Gas-assisted focused electron beam and ion beam processing and fabrication", J. Vac. Sci. Technol. B 26(4), 1197-1276, July/August 2008; N. Chekurov, et al., "Dry fabrication of microdevices by the combination of focused ion beam and cryogenic deep reactive ion etching", J. Micromech. Microeng. 20, 085009 (2010); Riika Puurunen, "Surface chemistry of atomic layer deposition: a case study for the trimethylaluminum/water process", J. App. Phys. 97, 121301 (2005); Steven M. George, "Atomic Layer Deposition: An Overview", Chem. Rev. (2010), 110(1), 111-31; I. P. Jain, et al., "Ion beam induced surface and interface engineering", Surface Sci. Rep. 66 (2011), 77-172; O. D. Roshchupkina et al., "Focused ion beam induced structural modifications in thin magnetic films", J. App. Phys. 112, 033901 (2012); Yutaka Yamada, et al., "Tuning Surface Wettability at the Submicron-Scale: Effect of Focused Ion Beam Irradiation on a Self-Assembled Monolayer", J. Phys. Chem. C (December 2015), DOI: 10.1021/acs.jpcc.5b09019; U.S. Pat. No. 6,355,994; U.S. Pat. No. 6,617,587; U.S. Pat. No. 6,734,428; U.S. Pat. No. 6,738,506; U.S. Pat. No. 6,777,675; U.S. Pat. No. 6,844,550; U.S. Pat. No. 6,872,958; U.S. Pat. No. 6,943,351; U.S. Pat. No. 6,977,375; U.S. Pat. No. 7,122,795; U.S. Pat. No. 7,227,142; U.S. Pat. No. 7,435,956; U.S. Pat. No. 7,456,402; U.S. Pat. No. 7,462,848; U.S. Pat. No. 7,786,454; U.S. Pat. No. 7,928,404; U.S. Pat. No. 7,941,237; U.S. Pat. No. 8,242,457; U.S. Pat. No. 8,384,048; U.S. Pat. No. 8,999,627; U.S. Pat. No. 8,999,628; and U.S. Pat. No. 9,184,027.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. patent application Ser. No. 14/085,768; U.S. patent application Ser. No. 14/703,306; U.S. patent application Ser. No. 14/607,821; U.S. patent application Ser. No. 14/522,563; U.S. patent application Ser. No. 14/523,909; U.S. patent application Ser. No. 14/694,710; U.S. patent application Ser. No. 14/695,767; U.S. patent application Ser. No. 14/695,776; U.S. patent application Ser. No. 14/695,785; U.S. patent application Ser. No. 14/745,463; U.S. patent application Ser. No. 14/809,985; and U.S. patent application Ser. No. 14/966,165.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method for targeted knock-on implantation using multiple charged particle beam columns, individual columns projecting individual charged particle beams at the substrate, comprising the actions of:
   a) injecting at least one gas, using local gas injectors, onto multiple different frames corresponding to multiple different ones of the beams, said gas selected such that a dopant species component of said gas will be adsorbed on the substrate surface; and
   b) scanning said frames using said corresponding beams, locations targeted by said beams in dependence on the design layout database, wherein a beam energy of said corresponding beams is selected to implant particles of said adsorbed gas impacted by particles of said beams to a selected substrate surface depth range.

2. The method of claim 1, wherein said injecting and said scanning are performed differently and simultaneously by different ones of said local gas injectors and said columns.

3. The method of claim 1, wherein said dopant species and said depth range are selected to increase etch sensitivity at said targeted locations within said depth range, further comprising blanket-etching the substrate.

4. The method of claim 1, wherein said dopant species and said depth range are selected such that dopant-implanted substrate surface comprises a hard mask, further comprising blanket-etching the substrate.

5. The method of claim 4, further comprising blanket-depositing an etch-sensitive material on the substrate prior to said step a), wherein said hard mask is formed in said etch-sensitive material.

6. The method of claim 1, wherein said adsorption is dissociative.

7. The method of claim 1, wherein a landing energy of said beams is modified by applying a selected voltage bias to the substrate.

8. The method of claim 1, wherein said corresponding beams are targeted in direct dependence on the design layout database.

9. The method of claim 1, further comprising monitoring a temperature of the substrate in corresponding frames using local photon detectors.

10. The method of claim 1, wherein different ones of said local gas injectors corresponding to different ones of the columns inject different gasses.

11. The method of claim 1, wherein said substrate surface comprises substrate material or a material deposited on the substrate.

12. A method for targeted ion implantation using multiple ion beam columns, individual columns projecting individual ion beams at the substrate, comprising the actions of:
targeting locations on the substrate surface with the beams in direct dependence on a design layout database, a beam energy of the beams selected to implant ions comprising the beams to a selected depth range in the substrate surface, ones of the ion beams comprising a selected dopant species;
wherein said targeting is performed differently and simultaneously by different ones of said columns.

13. The method of claim 12, wherein said dopant species and said depth range are selected to increase etch sensitivity at said targeted locations within said depth range, further comprising blanket-etching the substrate.

14. The method of claim 12, wherein said dopant species and said depth range are selected such that dopant-implanted substrate surface comprises a hard mask, further comprising etching the substrate.

15. The method of claim 14, further comprising blanket depositing an etch-sensitive material on the substrate prior to said targeting, wherein said depth range is selected to form said hard mask in said etch-sensitive material.

16. The method of claim 12, wherein different ones of the ion beams comprise different dopant species.

17. The method of claim 12, wherein different ones of the columns project corresponding ion beams with different beam energies.

18. The method of claim 12, wherein a landing energy of the beams is modified by applying a selected voltage bias to the substrate.

19. The method of claim 12, wherein said targeting step does not use a resist.

20. The method of claim 12, wherein said substrate surface comprises substrate material or a material deposited on the substrate.

* * * * *